United States Patent
Vadi et al.

(10) Patent No.: US 7,142,442 B1
(45) Date of Patent: Nov. 28, 2006

(54) SEGMENTED DATALINE SCHEME IN A MEMORY WITH ENHANCED FULL FAULT COVERAGE MEMORY CELL TESTABILITY

(75) Inventors: Vasisht Mantra Vadi, San Jose, CA (US); David P. Schultz, San Jose, CA (US); Steven P. Young, Boulder, CO (US); Jennifer Wong, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 110 days.

(21) Appl. No.: 10/796,750

(22) Filed: Mar. 8, 2004

(51) Int. Cl.
*G11C 5/06* (2006.01)
*G11C 8/00* (2006.01)
*G11C 7/00* (2006.01)

(52) U.S. Cl. .............. 365/63; 365/230.06; 365/189.08
(58) Field of Classification Search .............. 365/51, 365/52, 63, 230.03, 230.05, 230.06, 189.08
See application file for complete search history.

(56) References Cited

U.S. PATENT DOCUMENTS 5,847,990 A * 12/1998 Irrinki et al. .......... 365/230.05
6,335,896 B1    1/2002 Wahlstrom
6,577,521 B1 *  6/2003 Raad ................. 365/230.06
6,621,756 B1 *  9/2003 Lin et al. ............ 365/230.06
6,664,807 B1   12/2003 Crotty et al.
6,747,910 B1 *  6/2004 Tsuji ................. 365/230.06
6,856,574 B1 *  2/2005 Iwahashi et al. ...... 365/230.06
6,859,411 B1 *  2/2005 Pfeiffer et al. ....... 365/230.06
6,873,556 B1 *  3/2005 Hanji et al. .......... 365/230.03

OTHER PUBLICATIONS

Xilinx, Inc., "The Programmable Logic Data Book 1998," pp. 4-1 to 4-68, available from Xilinx, Inc., 2100 Logic Drive, San Jose, California, 95124.

* cited by examiner

*Primary Examiner*—Trong Phan
(74) *Attorney, Agent, or Firm*—William L. Paradise, III; Thomas A. Ward

(57) ABSTRACT

A memory includes a plurality of row segments, with each row segment having a number of memory cells coupled to a corresponding dataline segment pair. Dataline driver circuits are provided between row segments to buffer signals on adjacent dataline segments. A control circuit is coupled to at least one row segment, and provides control signals to the at least one row segment and to the dataline driver circuits.

39 Claims, 15 Drawing Sheets

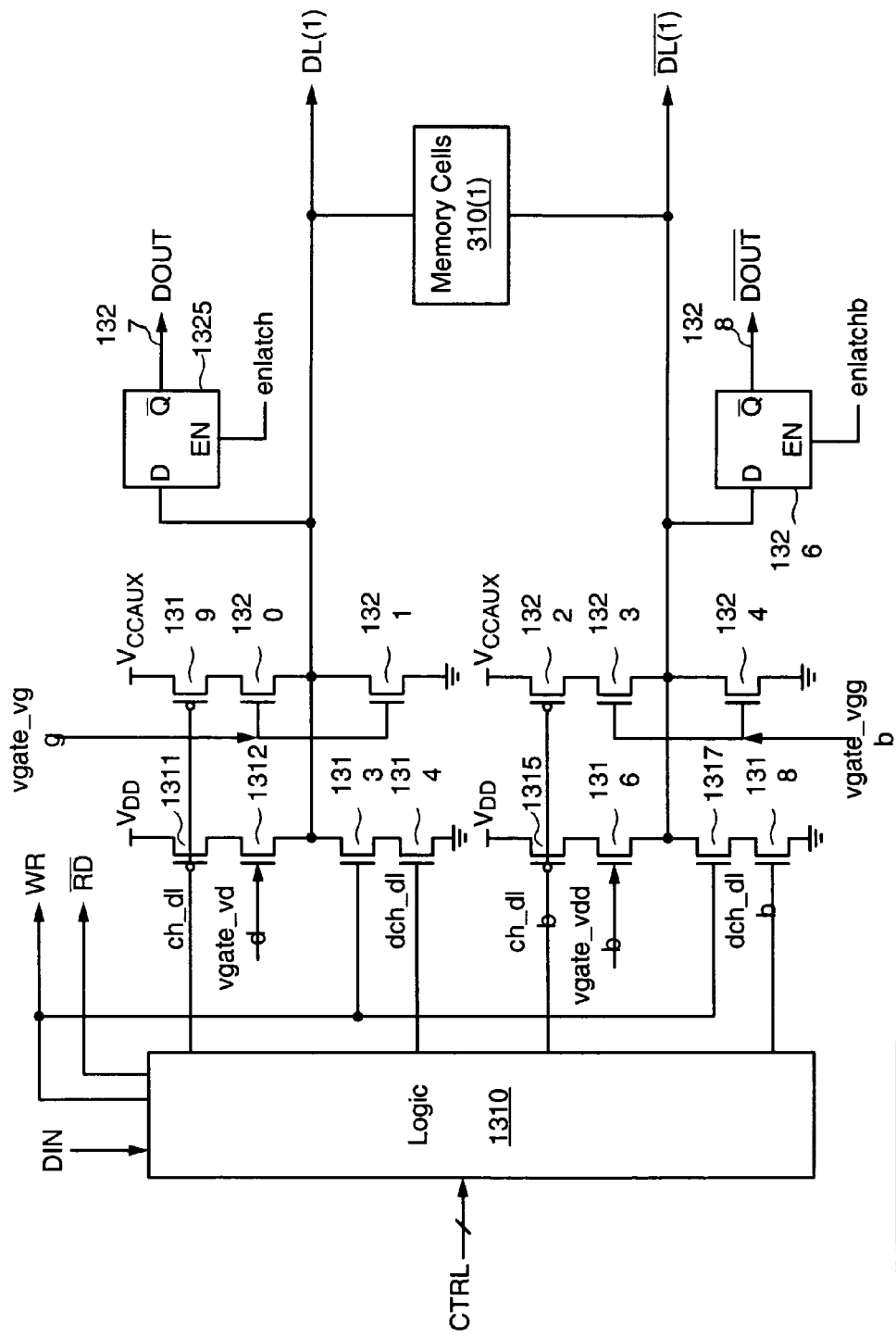

SEGMENTED DATALINE SCHEME IN A MEMORY WITH ENHANCED FULL FAULT COVERAGE MEMORY CELL TESTABILITY

FIELD OF INVENTION

The present invention relates generally to memories, and more specifically to memories having segmented datalines.

DESCRIPTION OF RELATED ART

FIG. 1 shows a row 100 of a conventional memory array that includes a plurality of well-known static random access memory (SRAM) cells 110(1)–110(n), each having a data output Q connected to a dataline DL via a first NMOS access transistor 112 and having a complementary data output $\overline{Q}$ connected to a complementary dataline $\overline{DL}$ via a second NMOS access transistor 114. The gates of access transistors 112 and 114 for each memory cell 110 are coupled to a corresponding address line AL. PMOS pre-charge transistors 120 and 122 are provided to pre-charge DL and $\overline{DL}$, respectively, to a logic high state in response to an active low pre-charge signal PC. A weak PMOS keeper transistor 130 is connected between $V_{DD}$ and DL, and has a gate coupled to DL via an inverter 132. Similarly, a weak PMOS keeper transistor 140 is connected between $V_{DD}$ and $\overline{DL}$, and has a gate coupled to DL via an inverter 142.

To program a memory cell 110, its corresponding address line AL is asserted to logic high, and the dataline pair DL and $\overline{DL}$ are driven to opposite logic states. Also, PC is de-asserted to logic high to turn off pre-charge transistors 120 and 122. For example, to select memory cell 110(1) for writing, address line AL(1) is asserted to logic high to turn on corresponding access transistors 112(1) and 114(1), and all other address lines AL(2)–AL(n) are de-asserted to logic low to turn off access transistors 112 and 114 associated with the non-selected memory cells 110(2)–110(n). To write a logic one to memory cell 110(1), DL is driven to logic high, which forces the Q output of cell 110(1) to logic high via access transistor 112(1), and $\overline{DL}$ is driven to logic low, which forces the $\overline{Q}$ output of cell 110(1) to logic low via access transistor 114(1). Conversely, to write a logic zero to memory cell 110(1), DL is driven to logic low, which forces the Q output of cell 110(1) to logic low via access transistor 112(1), and $\overline{DL}$ is driven to logic high, which forces the $\overline{Q}$ output of cell 110(1) to logic high via access transistor 114(1).

To read memory cell 110(1), PC is initially asserted to logic low to turn on pre-charge transistors 120 and 122, which in turn pre-charge DL and $\overline{DL}$ to logic high (i.e., towards $V_{DD}$). PC is then de-asserted to turn off pre-charge transistors 120 and 122, address line AL(1) is asserted to turn on access transistors 112(1) and 114(1), and address lines AL(2)–AL(n) are de-asserted to de-couple non-selected memory cells 110(2)–110(n) from DL and $\overline{DL}$. If the data bit stored in cell 110(1) is a logic zero (e.g., Q=0 and $\overline{Q}$=1), then the logic low signal at the Q output is passed to DL via access transistor 112(1), and the logic high signal at the $\overline{Q}$ output allows $\overline{DL}$ to remain in the logic high state. Conversely, if the data bit stored in cell 110(1) is a logic one (e.g., Q=1 and $\overline{Q}$=0), then the logic low signal at the $\overline{Q}$ output is passed to $\overline{DL}$ via access transistor 114(1), and the logic high signal at the Q output allows DL to remain in the logic high state. The opposite logic states on DL and $\overline{DL}$ are detected, for example, by a sense amplifier, a CMOS gate, or similar circuit (not shown for simplicity).

Although turned off during read operations by de-asserted address lines, the access transistors 112 and 114 of non-selected memory cells 110(2)–110(n) conduct leakage currents that can cause an erroneous discharge of DL and/or $\overline{DL}$, respectively. The PMOS keeper transistors 130 and 140 provide small charge currents to maintain DL and $\overline{DL}$, respectively, in their pre-charged logic high states prior to reading the selected memory cell 110(1), thereby compensating for the leakage currents in the non-selected memory cells 110(2)–110(n). However, when reading data from selected memory cell 110(1), a logic low signal at the Q output should be able to discharge DL to logic low, and a logic low signal at the $\overline{Q}$ output should be able to discharge $\overline{DL}$ to logic low. Thus, the drive strength of the NMOS discharge transistors (not shown) within the selected memory cell 110(1) should be stronger than that of keeper transistors 130 and 140 for memory cell 110(1) to drive DL and $\overline{DL}$ to opposite logic states during read operations. Accordingly, the drive strength of keeper transistors 130 and 140 is precisely selected to compensate for leakage currents in non-selected memory cells while allowing the selected memory cell to drive the dataline pair to opposite logic states.

As semiconductor fabrication processes become smaller, each row 100 of a memory array can include more memory cells 110 in the same amount of area. However, as the number of memory cells per row 100 increases, the leakage currents in non-selected cells 110 can become so large that the keeper transistors 130 and 140 are no longer able to compensate for the leakage currents. Although the drive strength of keeper transistors 130 and 140 can be increased to compensate for the increased leakage currents, the drive strength of the NMOS discharge transistors (not shown) within memory cells 110 would also have to be increased to prevent keeper transistors 130 and 140 from disturbing read operations. Increasing the drive strength of the NMOS discharge transistors in the memory cells undesirably increases the size of the memory cells, thereby limiting the number of memory cells per row. Further, re-sizing the keeper transistors for next generation devices that have more memory cells per row to compensate for leakage currents without disturbing read operations requires considerable time and expense.

SUMMARY

In accordance with the present invention, a memory is disclosed that has a plurality of row segments, with each row segment having a number of memory cells coupled to a corresponding dataline segment. Dataline driver circuits are provided to selectively drive read and write signals between adjacent row segments in response to read and write control signals generated by a control circuit. Each row segment also includes a weak keeper latch that compensates for leakage currents in non-selected memory cells in the row segment without disturbing read operations for a selected memory cell. By segmenting the datalines into a plurality of segments, the number of memory cells per dataline segment can be minimized to reduce undesirable leakage currents in corresponding row segments, thereby allowing the drive strength of the keeper latches to be minimized. This, in turn, allows the size of the memory cells to be minimized, thereby resulting in higher storage density. In addition, because each dataline segment is connected to only a subset of the memory cells in the row, capacitive loading on the datalines is reduced, which in turn improves performance. Further, for embodiments that employ SRAM cells, the control circuit and dataline drivers are configurable to test both the PMOS pull-up transistors and the NMOS pull-down transistors for defects, thereby allowing for full fault coverage of the memory.

After the keeper latch and memory cells in a row segment are scaled relative to each other to compensate for leakage currents without disturbing read operations, the row segment can be formed as a tile and replicated any number of times across a substrate to form a memory. In this manner, memories of various sizes can be formed using identical tiles, thereby eliminating the need to re-scale the keeper latches and/or memory cells for memories of different sizes. The ability to form a memory using a plurality of identical tiles can provide a distinct competitive advantage by offering increased memory flexibility without incurring design and testing costs previously associated with re-sizing the keeper latches relative to the memory cells.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of an exemplary array of SRAM cells for simplicity only. It is to be understood that embodiments of the present invention may be equally applicable to other memory array configurations and other memory cells, such as DRAM cells, EPROM cells, EEPROM cells, Flash cells, and the like. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary and, thus, can be modified (e.g., reversed polarity) as desired. In addition, the voltage levels for logic signals and the supply voltage can be adjusted as desired. Accordingly, the present invention is not to be construed as limited to specific examples described herein but rather includes within its scope all embodiments defined by the appended claims.

Figure 1:
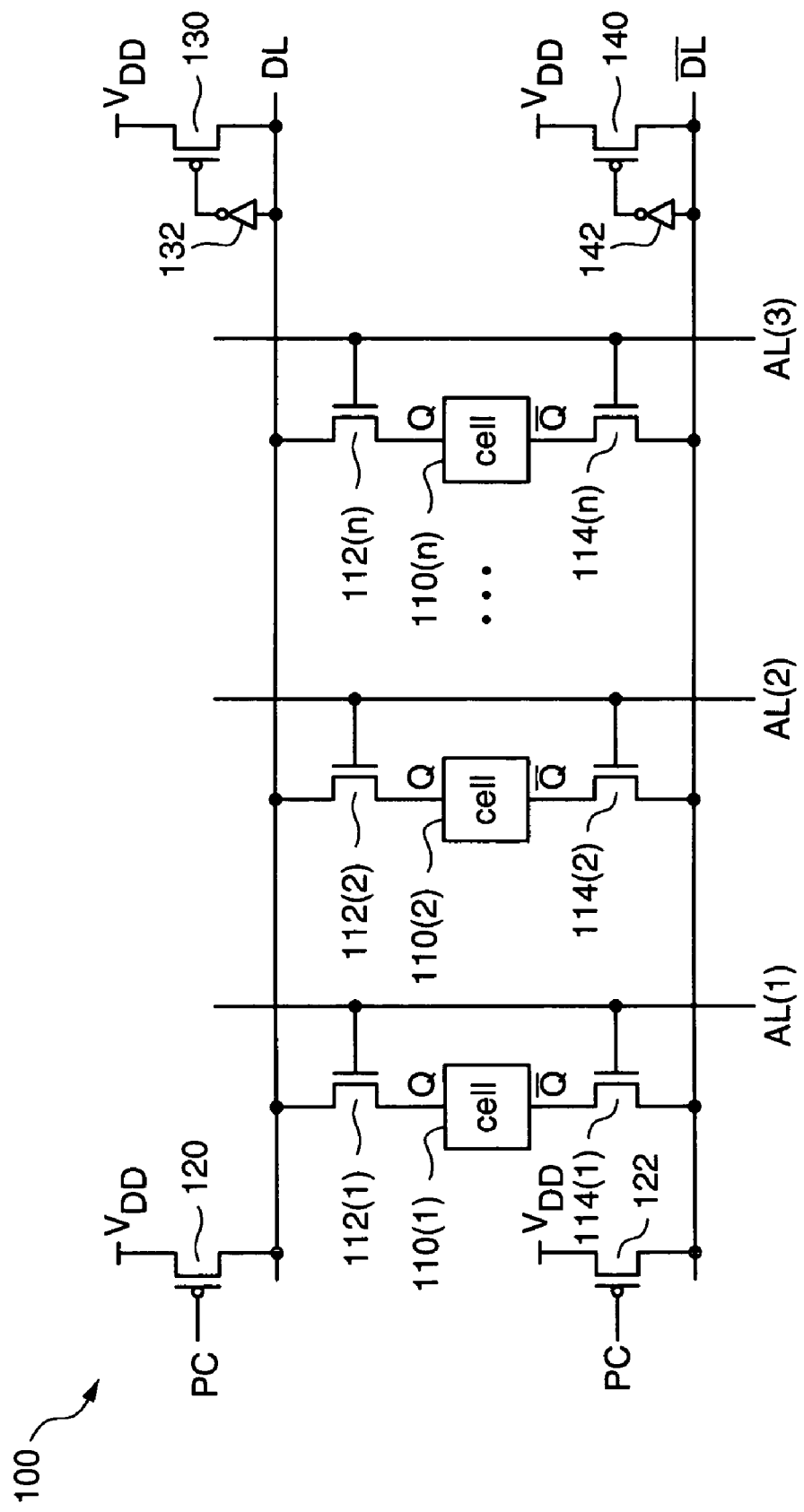
FIG. 1 is a block diagram of a row a conventional memory array.
Figure 2:
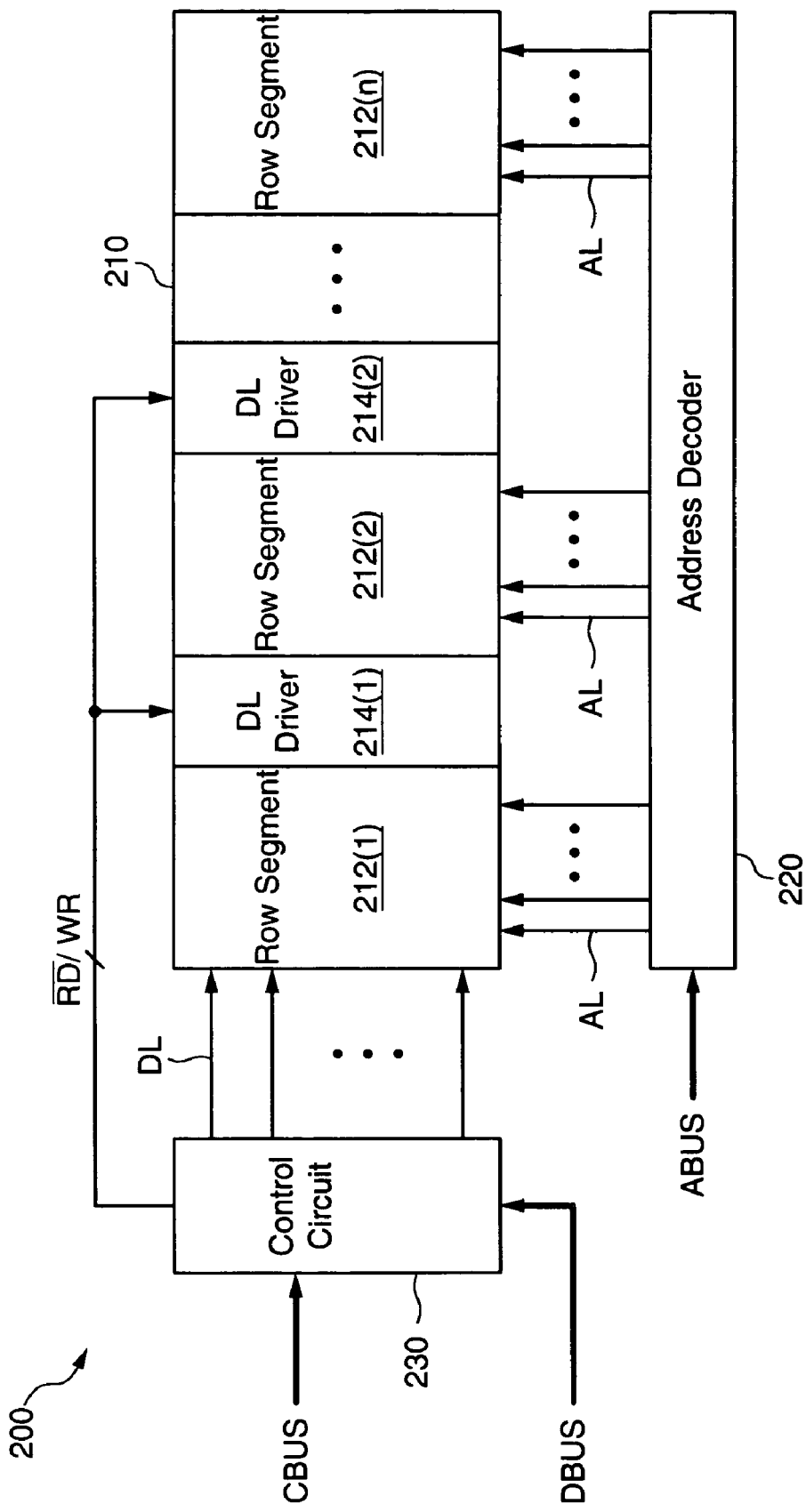
FIG. 2 illustrates the general layout of a memory system in accordance with the present invention.

FIG. 2 shows a memory system 200 in accordance with some embodiments of the present invention. Memory system 200 is shown to include a memory array 210, an address decoder circuit 220, and a read/write control circuit 230. Array 210 includes any number of rows and columns of memory cells (not shown in FIG. 2 for simplicity). For some embodiments, the memory cells are SRAM cells, although other memory cells can be used. Each row in array 210 is connected to control circuit 230 via a corresponding dataline pair DL, and each column in array 210 is connected to address decoder 220 via corresponding address lines AL. Address decoder 220 is well-known, and includes circuitry to select one of address lines AL in response to an address provided on an address bus ABUS. Read/write control circuit 230 controls read, write, and test operations for array 210, and is coupled to a data bus DBUS and to a control bus CBUS. DBUS provides write data to and routes read data from array 210 via control circuit 230. CBUS provides various control signals and instructions to control circuit 230. For some embodiments, DBUS and CBUS may be the same bus. For other embodiments, data, instructions, and/or control signals may be provided to control circuit 230 as a serial bitstream provided by a shift register. Other well-known elements of memory system 200, such as instruction decoders, are not shown for simplicity. Note that rows and columns are only used to an abstract organization of a memory, and that actual physical implementations may take on other arrangements. For instance, a row may be implemented as a column by simple rotation.

As illustrated in FIG. 2, the rows of memory array 210 are divided into a plurality of row segments 212(1)–212(n), each of which can include any suitable number of memory cells. For some embodiments, the row segments include the same number of memory cells, while in other embodiments the row segments include different numbers of memory cells. Each row segment 212(1)–212(n) includes an associated dataline segment to which the memory cells therein are connected (for simplicity, the dataline segments are not shown in FIG. 2). Dataline drivers 214 are provided to selectively buffer signals between dataline segments in adjacent row segments 212 in response to read and write control signals $\overline{RD}$ and WR. Signals $\overline{RD}$ and WR are active low and active high signals, respectively, generated by control circuit 230. For some embodiments, WR and $\overline{RD}$ are the same signal.

As explained below, during write operations, dataline drivers 214 propagate write data in a first direction from control circuit 230 along adjacent dataline segments to selected memory cells, while during read operations dataline drivers 214 propagate read data in a second direction from selected memory cells along adjacent dataline segments to control circuit 230. Further, during testing and other operations, dataline drivers 214 can drive corresponding dataline segments to predetermined logic states, and can also tri-state corresponding dataline segments. As noted earlier, a segmented dataline in accordance with the present invention allows for the construction of very large memories that occupy minimal area, thereby reducing cost of devices including such memories. In particular, using dataline drivers 214 rather than duplicating control circuit 230 to drive the segments requires less area. Such memories having a segmented dataline architecture in accordance with the present invention may be especially well-suited for applications (such as an FPGA) where performance (speed) of the memory is not the primary design consideration.

Figure 3:
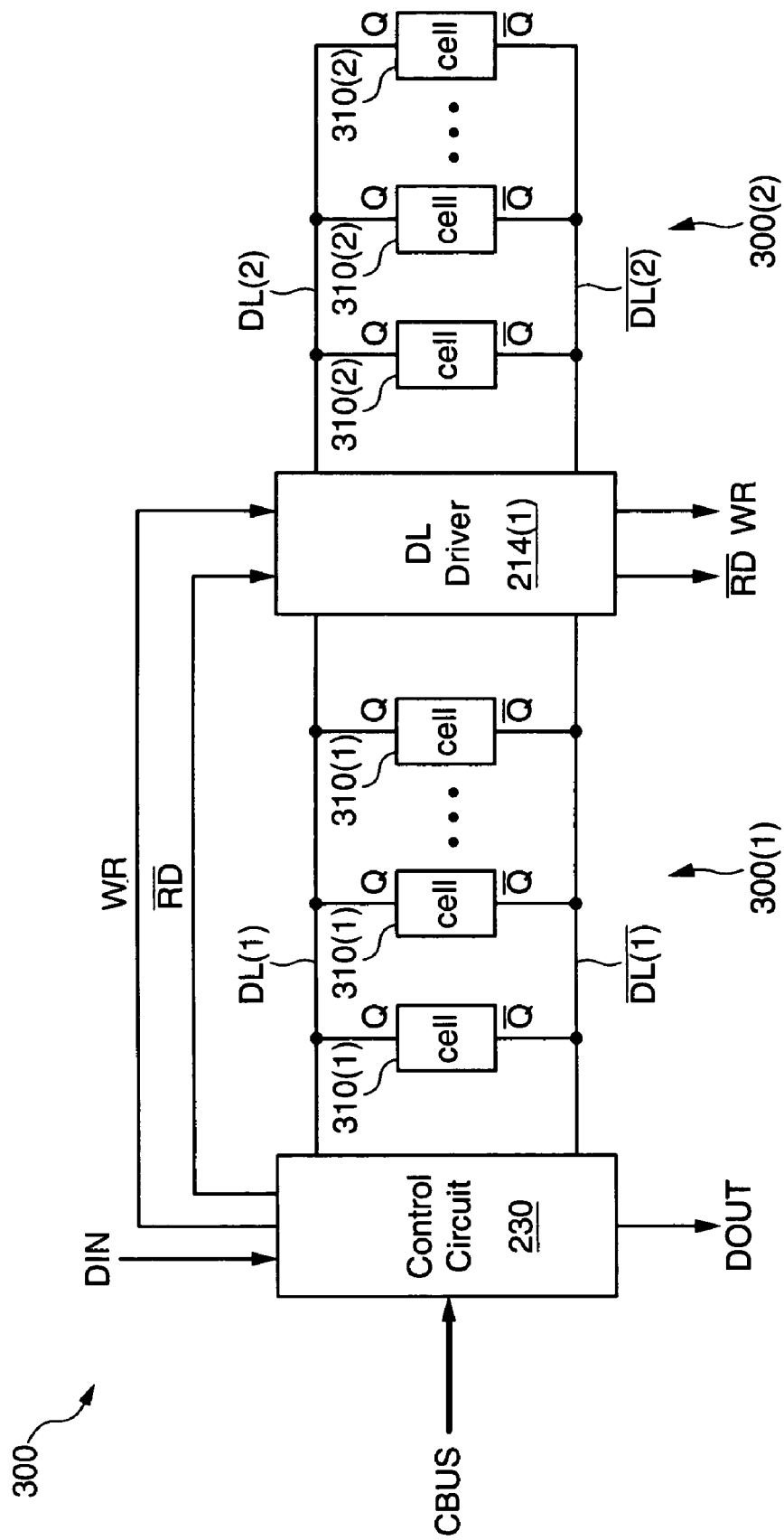
FIG. 3 is a simplified block diagram for one embodiment of a row of the memory array of FIG. 2.

FIG. 3 is a simplified block diagram illustrating a row 300 of memory array 210 coupled to a corresponding portion of control circuit 230. For simplicity, row 300 is shown in FIG. 3 to include only two row segments 300(1)–300(2) and one dataline driver 214(1) connected between the segments. Of course, for other embodiments, row 300 may include any number of row segments and dataline drivers. First row segment 300(1) includes a first plurality of memory cells 310(1) each having a Q output connected to a first dataline segment DL(1) and a $\overline{Q}$ output connected to a first complementary dataline segment $\overline{DL(1)}$. The first dataline segment pair DL(1)/$\overline{DL(1)}$ is connected between control circuit 230 and first ports of dataline driver 214(1). Second row segment 300(2) includes a second plurality of memory cells 310(2) each having a Q output connected to a second dataline segment DL(2) and a $\overline{Q}$ output connected to a second complementary dataline segment $\overline{DL(2)}$. The second dataline segment pair DL(2)/$\overline{DL(2)}$ is connected to second ports of dataline driver 214(1).

Figure 4:
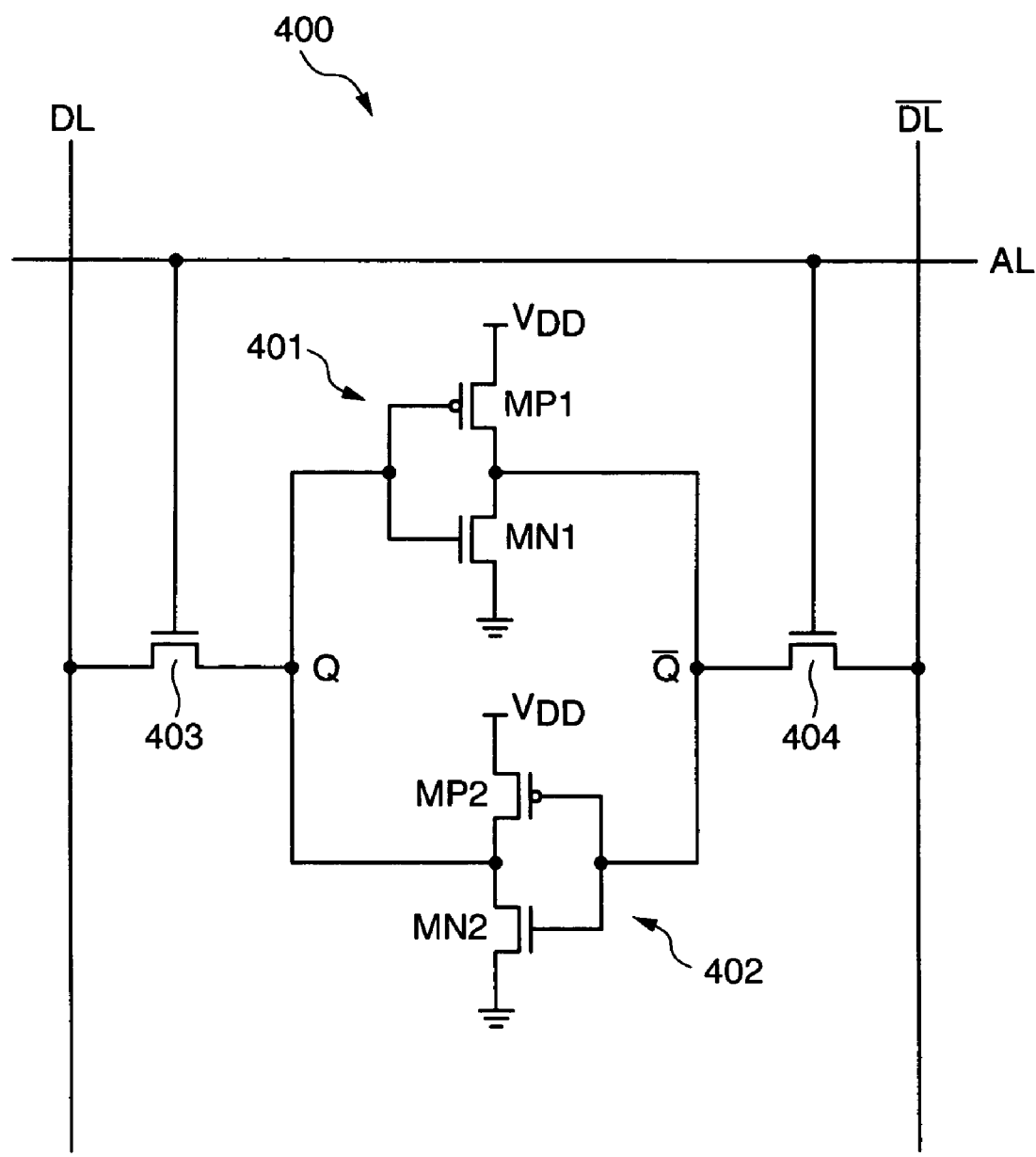
FIG. 4 is a schematic diagram of one embodiment of the memory cells for the row of FIG. 3.

Although not shown in FIG. 3 for simplicity, each memory cell 310 includes access transistors that selectively connect the cell's data outputs to DL and $\overline{DL}$ in response to a decoded address signal provided on a corresponding address line. For example, FIG. 4 shows an SRAM cell 400 that is one embodiment of memory cells 310. SRAM cell 400 includes a latch formed by cross-coupled inverters 401 and 402, as well as NMOS access transistors 403 and 404. Inverter 401 includes PMOS transistor MP1 and NMOS transistor MN1 coupled between $V_{DD}$ and ground potential, with the gates of MP1 and MN1 coupled to the Q output of the memory cell. Inverter 402 includes PMOS transistor MP2 and NMOS transistor MN2 coupled between $V_{DD}$ and ground potential, with the gates of MP2 and MN2 coupled to the $\overline{Q}$ output of the memory cell. NMOS access transistor 403 is connected between Q and DL, and has a gate coupled to corresponding address line AL. NMOS access transistor 404 is connected between $\overline{Q}$ and $\overline{DL}$, and has a gate coupled to AL. For some embodiments, memory cells 400 are well-known mid-ox SRAM cells designed for 1.5 volt operation.

Referring again to FIG. 3, control circuit 230 includes an input to receive an input data bit DIN, and includes an output to provide an output data bit DOUT. For some embodiments, DIN and DOUT are provided on the same DBUS (see also FIG. 2). Further, control circuit 230 includes outputs to provide $\overline{RD}$ and WR to corresponding inputs of dataline driver 214, which in turn includes corresponding outputs to provide $\overline{RD}$ and WR to the dataline driver in the next row (only one row is shown in FIG. 3 for simplicity). For some embodiments, $\overline{RD}$ and WR may be buffered by suitable drive circuits (not shown) every m rows of array 210 to maintain desired signal strengths for $\overline{RD}$ and WR. For other embodiments, $\overline{RD}$ and WR can be provided to the dataline driver(s) 214 in each row from the control circuit 230. Further, although not shown in FIG. 3, weak keeper latches are provided for each pair of dataline segments to compensate for memory cell leakage currents in corresponding row segments.

By segmenting each dataline of array 210 into a plurality of buffered dataline segments, the number of memory cells per dataline segment can be minimized to reduce undesirable leakage currents in corresponding row segments, thereby allowing the drive strength of the keeper latches to be minimized. Minimizing the drive strength of the keeper latches allows the size of the memory cells 310 in array 210 to be minimized, which in turn can result in higher storage density. In addition, because each dataline segment is connected to only a subset of the memory cells in the row, capacitive loading on the datalines is reduced, which in turn improves performance.

For some embodiments, after the keeper latch and memory cells in a row segment are scaled relative to each other to compensate for leakage currents without disturbing read operations, the row segment can be formed as a tile and replicated any number of times across a substrate to form a memory array. In this manner, memory arrays of various sizes can be formed using identical tiles, thereby eliminating the need to re-scale the keeper latches and/or memory cells for arrays of different sizes. The ability to form a memory array using a plurality of identical tiles can provide a distinct competitive advantage by offering increased memory array flexibility without incurring design and testing costs previously associated with re-sizing the keeper latches relative to the memory cells.

Figures 5, 5A:
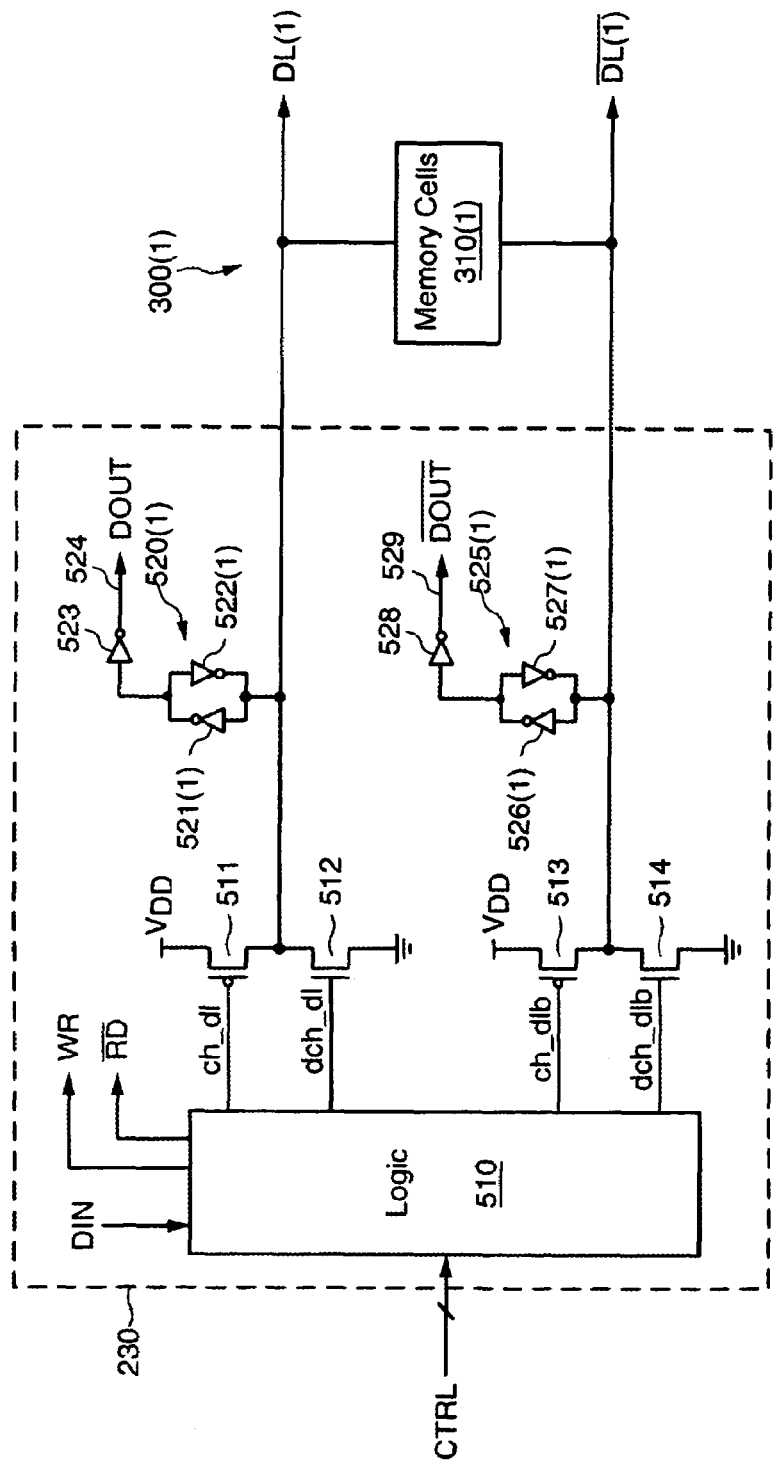
FIG. 5 is a more detailed block diagram for one embodiment of the row of FIG. 3.
Figure 5B:
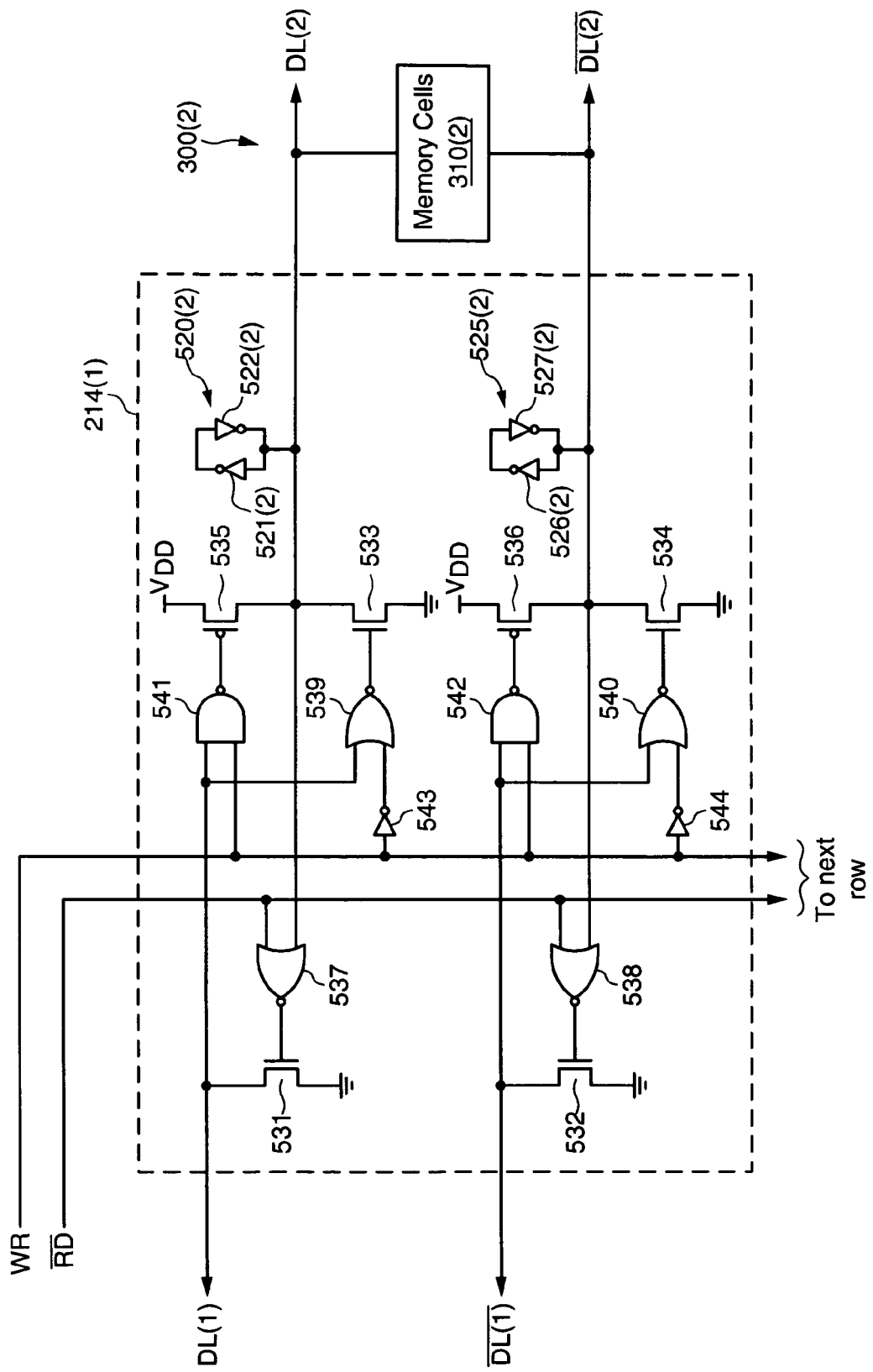

FIG. 5 shows elements of the exemplary row 300 of FIG. 3 in more detail. For simplicity, the memory cells 310(1) in first row segment 300(1) and the memory cells 310(2) in second row segment 300(2) are shown collectively in FIG. 5. Control circuit 230 includes logic 510, PMOS pull-up transistors 511 and 513, and NMOS pull-down transistors 512 and 514. Logic 510 receives DIN and various control signals CTRL and, in response thereto, generates driver control signals $\overline{RD}$ and WR, as well as dataline control signals ch_dl, dch_dl, ch_dlb, and dch_dlb. As mentioned above, for some embodiments, WR and $\overline{RD}$ are the same signal. PMOS transistor 511 is coupled between $\overline{DL(1)}$ and $V_{DD}$, and has a gate responsive to ch_dl. NMOS transistor 512 is coupled between DL(1) and ground potential, and has a gate responsive to dch_dl. PMOS transistor 513 is coupled between $\overline{DL(1)}$ and $V_{DD}$, and has a gate responsive to ch_dlb. NMOS transistor 514 is coupled between $\overline{DL(1)}$ and ground potential, and has a gate responsive to dch_dlb. For the exemplary embodiment described herein, signals ch_dl and ch_dlb are active low charge signals, and dch_dl and dch_dlb are active high discharge signals.

A weak keeper latch 520(1) is coupled between DL(1) and a first read-back line 524 via inverter 523 to provide DOUT, and includes cross-coupled CMOS inverters 521(1) and 522(1). A weak keeper latch 525(1) is coupled between $\overline{DL(1)}$ and a second read-back line 529 via inverter 528 to provide $\overline{DOUT}$ (which is the complement of DOUT), and includes cross-coupled CMOS inverters 526(1) and 527(1). Thus, data that is read from a selected memory cell 310 in row 300 can be detected by sensing DOUT and/or $\overline{DOUT}$. For some embodiments, DOUT and $\overline{DOUT}$ can be multiplexed in a well-known manner to select which line 524 or 529 outputs the read data. For other embodiments, inverter 528 can be eliminated so that DOUT can be sensed on either line 524 or 529. For another embodiment, DOUT and $\overline{DOUT}$ can be used to provide a differential output signal. Keeper latches 520(1) and 525(1) are scaled to compensate for leakage currents in memory cells 310(1) of first row segment 300(1) while allowing a selected memory cell 310 to drive DL(1) and $\overline{DL(1)}$ to opposite logic states during read operations. For some embodiments, keeper latches 520(1) and 525(1) are identical.

Dataline driver 214(1) includes NMOS transistors 531–534, PMOS transistors 535–536, NOR gates 537–540, NAND gates 541–542, inverters 543–544, and weak keeper latches 520(2) and 525(2). Keeper latches 520(2) and 525(2), which are similar to keeper latches 520(1) and 525(1), are scaled to compensate for leakage currents in the non-selected memory cells while allowing a selected memory cell to drive DL and $\overline{DL}$ to opposite logic states. For some embodiments, keeper latches 525(2) and 520(1) are identical. For other embodiments, keeper latches 520(2) and 525(2) are formed as part of second row segment 300(2).

NMOS transistor 531 is coupled between DL(1) and ground potential, and has a gate coupled to an output of NOR gate 537, which includes a first input coupled to DL(2) and a second input to receive RD. NMOS transistor 532 is coupled between $\overline{DL(1)}$ and ground potential, and has a gate coupled to an output of NOR gate 538, which includes a first input coupled to $\overline{DL(2)}$ and a second input to receive $\overline{RD}$. Thus, transistor 531 can selectively discharge DL(1) in response to DL(2) and $\overline{RD}$, and transistor 532 can selectively discharge $\overline{DL(1)}$ in response to $\overline{DL(2)}$ and $\overline{RD}$.

PMOS transistor 535 is coupled between $V_{DD}$ and DL(2), and has a gate coupled to an output of NAND gate 541, which includes a first input to receive WR and a second input coupled to DL(1). NMOS transistor 533 is coupled between DL(2) and ground potential, and has a gate coupled to an output of NOR gate 539, which includes a first input to receive an inverted write signal $\overline{WR}$ provided by inverter 543 and a second input coupled to DL(1). PMOS transistor 536 is coupled between $V_{DD}$ and $\overline{DL(2)}$, and has a gate coupled to an output of NAND gate 542, which includes a first input to receive WR and a second input coupled to $\overline{DL(1)}$. NMOS transistor 534 is coupled between $\overline{DL(2)}$ and ground potential, and has a gate coupled to an output of NOR gate 540, which includes a first input to receive $\overline{WR}$ provided by inverter 544 and a second input coupled to $\overline{DL(1)}$. Thus, PMOS transistor 535 and NMOS transistor 533 can selectively drive DL(2) in response to WR and DL(1), and PMOS transistor 536 and NMOS transistor 534 can selectively drive $\overline{DL(2)}$ in response to WR and $\overline{DL(1)}$.

For write operations, logic 510 drives DL(1) and $\overline{DL(1)}$ to opposite logic states indicative of DIN by selectively asserting dataline control signals ch_dl, dch_dl, ch_dlb, and dch_dlb. Logic 510 also asserts WR to logic high and de-asserts $\overline{RD}$ to logic high, which causes dataline driver 214(1) to propagate DIN from DL(1) to DL(2) and to propagate $\overline{DIN}$ (which is the complement of DIN) from $\overline{DL(1)}$ to $\overline{DL(2)}$. In this manner, dataline driver 214(1) propagates write signals in only one direction, i.e., from first row segment 300(1) to second row segment 300(2).

Thus, to write a logic one to a selected memory cell 310 in row 300, logic 510 drives DL(1) to logic high (e.g., DIN=1) and drives $\overline{DL(1)}$ to logic low (e.g., $\overline{DIN}$=0). For example, logic 510 asserts ch_dl to logic low to turn on transistor 511 and thereby charge DL(1) toward $V_{DD}$, and asserts dch_dlb to logic high to turn on transistor 514 and thereby discharge $\overline{DL(1)}$ toward ground potential. Logic 510 also de-asserts dch_dl to logic low to turn off transistor 512, thereby isolating DL(1) from ground potential, and de-asserts ch_dlb to logic high to turn off transistor 513, thereby isolating $\overline{DL(1)}$ from $V_{DD}$. Because WR is asserted to logic high, the logic high state of DL(1) turns on transistor 535 via NAND gate 541 and turns off transistor 533 via NOR gate 539, thereby charging DL(2) toward $V_{DD}$ to propagate DIN=1 from DL(1) to DL(2). Similarly, because WR is asserted to logic high, the logic low state of $\overline{DL(1)}$ turns off transistor 536 via NAND gate 542 and turns on transistor 534 via NOR gate 540, thereby discharging $\overline{DL(2)}$ toward ground potential to propagate $\overline{DIN}$=0 from $\overline{DL(1)}$ to $\overline{DL(2)}$.

Conversely, to write a logic zero to a selected memory cell 310 in row 300, logic 510 drives DL(1) to logic low (e.g., DIN=0) and drives $\overline{DL(1)}$ to logic high (e.g., $\overline{DIN}$=1). For example, logic 510 asserts dch_dl to logic high to turn on transistor 512 and thereby discharge DL(1) toward ground potential, and asserts ch_dlb to logic low to turn on transistor 513 and thereby charge $\overline{DL(1)}$ towards $V_{DD}$. Logic 510 also de-asserts ch_dl to logic high to turn off transistor 511, thereby isolating DL(1) from $V_{DD}$, and de-asserts dch_dlb to logic low to turn off transistor 514, thereby isolating $\overline{DL(1)}$ from ground potential. Because WR is asserted, the logic low state of DL(1) turns off transistor 535 via NAND gate 541 and turns on transistor 533 via NOR gate 539, thereby discharging DL(2) toward ground potential to propagate DIN=0 from DL(1) to DL(2). Similarly, because WR is asserted, the logic high state of $\overline{DL(1)}$ turns on transistor 536 via NAND gate 542 and turns off transistor 534 via NOR gate 540, thereby charging $\overline{DL(2)}$ toward $V_{DD}$ to propagate $\overline{DIN}$=1 from $\overline{DL(1)}$ to $\overline{DL(2)}$.

For read operations, logic 510 initially pre-charges DL(1) and $\overline{DL(1)}$ to logic high states using dataline control signals ch_dl, dch_dl, ch_dlb, and dch_dlb. For example, logic 510 asserts ch_dl to turn on transistor 511 to pre-charge DL(1) toward $V_{DD}$, and asserts ch_dlb to turn on transistor 513 to pre-charge $\overline{DL(1)}$ toward $V_{DD}$. Logic 510 de-asserts dch_dl and dch_dlb to turn off transistors 512 and 514, respectively. Also, logic 510 initially asserts WR so that dataline driver 214(1) pre-charges DL(2) in response to DL(1) and pre-charges $\overline{DL(2)}$ in response to $\overline{DL(1)}$. After the dataline pair is pre-charged to logic high, logic 510 de-asserts ch_dl and ch_dlb to turn off transistors 511 and 513, respectively, and de-asserts WR to turn off transistors 533–536. In addition, logic 510 asserts $\overline{RD}$ to logic low so that DL(1) becomes responsive to DL(2) via pull-down transistor 531 and $\overline{DL(1)}$ becomes responsive to $\overline{DL(2)}$ via pull-down transistor 532.

For example, referring also to FIG. 4, to read a data bit stored in a memory cell 400 in the second row segment 300(2), the memory cell 400 is selected by asserting its corresponding address line AL to logic high, thereby allowing the data bit at the Q output of the selected cell 400 to pass to DL(2) via access transistor 403, and allowing the complementary data bit at the $\overline{Q}$ output of the selected cell 400 to pass to $\overline{DL(2)}$ via access transistor 404. Thus, if the selected cell 400 stores a logic one (e.g., Q=1, $\overline{Q}$=0), access transistor 403 maintains DL(2) at logic high, and access transistor 404 drives $\overline{DL(2)}$ to logic low. Because $\overline{RD}$ is asserted to logic low, the logic high state on DL(2) forces the output of NOR gate 537 to logic low, thereby turning off transistor 531 and allowing DL(1) to remain in its pre-charged logic high state. The logic high signal on DL(1) is passed through inverters 521(1) and 523 to produce a logic one output signal DOUT. Also, because $\overline{RD}$ is asserted to logic low, the logic low state on $\overline{DL(2)}$ forces the output of NOR gate 538 to logic high, thereby turning on transistor 532 to discharge $\overline{DL(1)}$ to logic low. In this manner, dataline driver 214(1) propagates a logic zero from $\overline{DL(2)}$ to $\overline{DL(1)}$ during the read operation. The logic low signal on $\overline{DL(1)}$ is passed through inverters 526(1) and 528 to produce a logic zero output signal $\overline{DOUT}$.

Conversely, if the selected cell 400 stores a logic zero (e.g., Q=0, $\overline{Q}$=1), access transistor 403 drives DL(2) to logic low, and access transistor 404 maintains $\overline{DL(2)}$ in its logic high state. The logic low state on DL(2) forces the output of NOR gate 537 to logic high, thereby turning on transistor 531 to discharge DL(1) to logic low. The logic low signal propagated from DL(2) to DL(1) is passed through inverters 521(1) and 523 to produce a logic zero output signal DOUT. The high logic state on $\overline{DL(2)}$ forces the output of NOR gate 538 to low, which turns off transistor 532, thereby allowing $\overline{DL(1)}$ to remain in its pre-charged logic high state. The logic high signal on $\overline{DL(1)}$ is passed through inverters 526(1) and 528 to produce a logic one output signal $\overline{DOUT}$.

For some embodiments, CMOS inverters 521(1)–521(2) and 526(1)–526(2) are relatively strong inverters, and CMOS inverters 522(1)–522(2) and 527(1)–527(2) are relatively weak inverters, where the strong inverters have a drive strength approximately 10 times that of the weak inverters. For one embodiment, where memory cells 310 are fabricated using a 0.09 micron process technology, the NMOS and PMOS transistors in relatively strong inverters 521 and 526 each have channel width of approximately 0.2 microns and a channel length of approximately 0.08 microns, while the NMOS transistors in relatively weak inverters 522 and 527 each have channel width of approximately 0.2 microns and a channel length of approximately 0.7 microns, and the PMOS transistors in relatively weak inverters 522 and 527 each have channel width of approximately 0.2 microns and a channel length of approximately 1.4 microns.

Control circuit 230 and dataline driver 214(1) can also be used to test both the PMOS pull-up transistors and the NMOS pull-down transistors within memory cells 310 for defects, thereby providing complete fault coverage for the memory cells in array 210. Referring also to FIG. 4, an exemplary test operation for NMOS pull-down transistors MN1 and MN2 of memory cell 400 is described below with respect to the flowchart of FIG. 6, and an exemplary test operation for PMOS pull-up transistors MP1 and MP2 of memory cell 400 is described below with respect to the flowchart of FIG. 7. Although these exemplary test operations are described below for a selected memory cell 400 in the second row segment 300(2), it is to be understood that test operations in accordance with the present invention are applicable for testing any of the memory cells of array 210, and that more than one memory cell can be tested at the same time.

Figure 6:
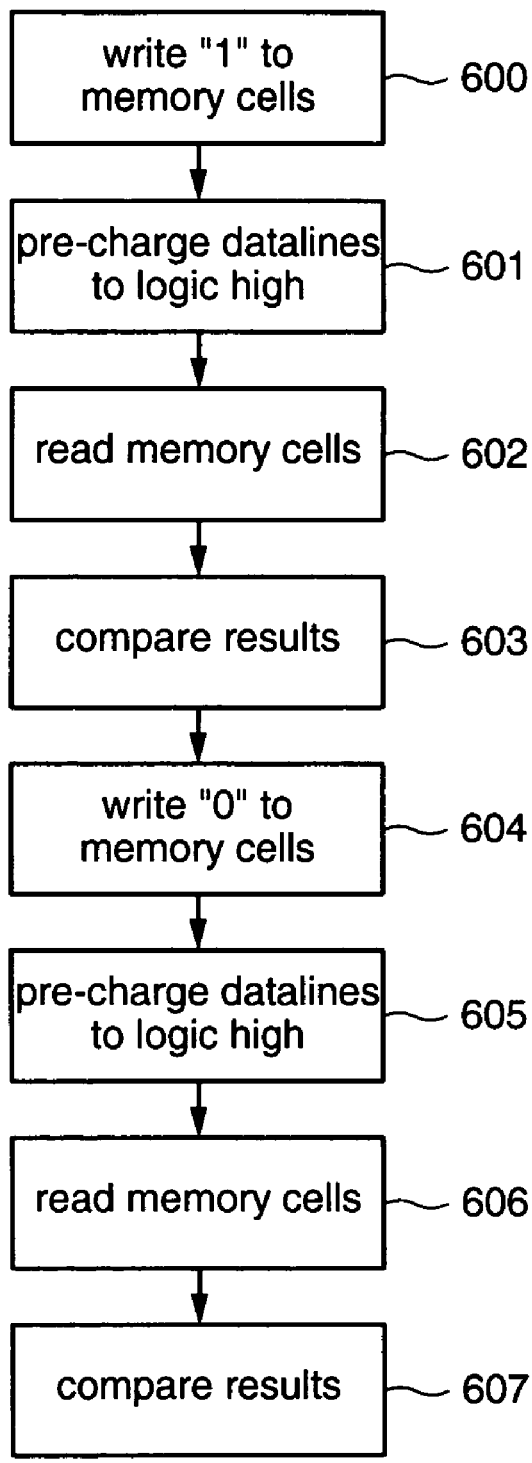
FIG. 6 is a flow chart illustrating an exemplary operation for testing the NMOS pull-down transistors in the memory cell of FIG. 4.

Referring now to the flowchart of FIG. 6, to test NMOS transistor MN1 in memory cell 400 for defects, logic 510 writes a logic one (e.g., DIN=1) into the memory cells in row 300 in the manner described above (step 600). After the write operation, control circuit 230 commences a read operation by pre-charging the dataline segments to logic high (step 601), and then reads data from the selected memory cell 400 in the manner described above (step 602). Thus, for the selected memory cell 400, the logic high Q output should turn on NMOS transistor MN1 and thereby discharge $\overline{DL(2)}$ to ground potential via access transistor 404. Dataline driver 214 propagates the logic low signal on $\overline{DL(2)}$ to $\overline{DL(1)}$. The results are then compared (step 603). If $\overline{DL(1)}$ is logic low, which indicates that NMOS pull-down transistor MN1 overpowered keeper latch 525(2) to discharge $\overline{DL(2)}$ to logic low, then transistor MN1 is considered non-defective. Conversely, if $\overline{DL(1)}$ is not logic low, which indicates that NMOS pull-down transistor MN1 cannot overpower keeper latch 525(2) to discharge $\overline{DL(2)}$ to logic low, then transistor MN1 is considered defective.

To test NMOS transistor MN2 in memory cell 400 for defects, logic 510 writes a logic zero (e.g., DIN=0) into the memory cells in row 300 (step 604). After the write operation, control circuit 230 pre-charges the dataline segments to logic high (step 605), and then reads data from the selected memory cell 400 (step 606). Thus, for the selected memory cell 400, the logic high $\overline{Q}$ output should turn on NMOS transistor MN2 and thereby discharge DL(2) to ground potential via access transistor 403. Dataline driver 214 propagates the logic low signal on DL(2) to DL(1). The results are then compared (step 607). If DL(1) is logic low, which indicates that NMOS pull-down transistor MN2 overpowered keeper latch 520(2) to discharge DL(2) to logic low, then transistor MN2 is considered non-defective. Conversely, if DL(1) is not logic low, which indicates that NMOS pull-down transistor MN2 cannot overpower keeper latch 520(2) to discharge DL(2) to logic low, then transistor MN2 is considered defective.

Figure 7:
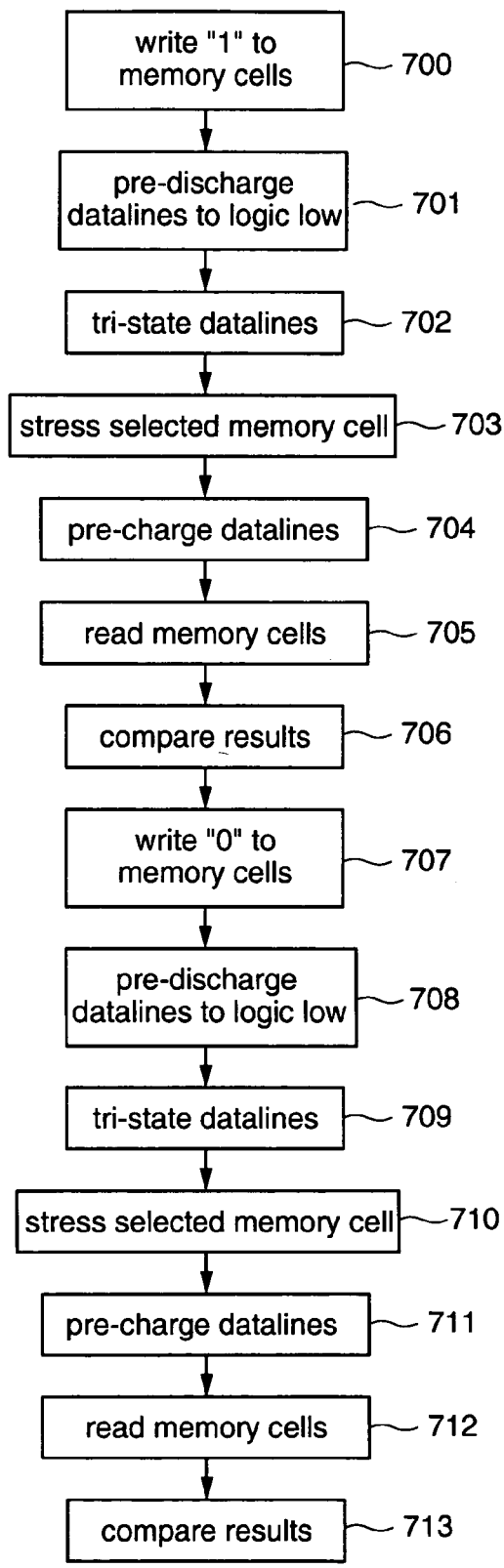
FIG. 7 is a flow chart illustrating an exemplary operation for testing the PMOS pull-up transistors in the memory cell of FIG. 4.

Referring now to the flowchart of FIG. 7, to test PMOS transistor MP2 in memory cell 400 for defects, logic 510 writes a logic one (e.g., DIN=1) into the memory cells in row 300 (step 700). After the write operation, control circuit 230 pre-discharges the dataline pair to ground potential (step 701). For example, $\overline{DL(1)}$ is pre-discharged by asserting dch_dl to turn on transistor 512 and de-asserting ch_dl to turn off transistor 511, and $\overline{DL(1)}$ is pre-discharged by asserting dch_dlb to turn on transistor 514 and de-asserting ch_dlb to turn off transistor 513. Logic 510 asserts WR so that the pre-discharged (e.g., logic low) states of DL(1) and $\overline{DL(1)}$ are propagated to DL(2) and $\overline{DL(2)}$, respectively. Then, control circuit 230 tri-states the dataline segment pairs (step 702). For example, logic 510 de-asserts dch_dl and dch_dlb to turn off transistors 512 and 514 respectively, de-asserts $\overline{RD}$ to turn off transistors 531 and 532, and de-asserts WR to turn off transistors 533–536. In this manner, neither segment of DL or $\overline{DL}$ is actively driven.

Next, the selected memory cell 400 is stressed to determine whether its pull-up transistor MP2 is defective (step 703). For example, the address line AL of the selected memory cell 400 is asserted to turn on the cell's access transistors 403 and 404, thereby coupling its Q output to DL(2) and coupling its $\overline{Q}$ output to $\overline{DL(2)}$. Because $\overline{Q}$ is logic low, the selected cell's PMOS pull-up transistor MP2 is conductive and should maintain the Q output in the logic high state. If PMOS transistor MP2 cannot overpower keeper latch 520(2), e.g., because of defects in transistor MP2, the Q output discharges via access transistor 403 and DL(2), thereby flipping the logic state of the selected cell 400. Otherwise, if PMOS transistor MP2 can overpower keeper latch 520(2), the logic high state of the selected cell 400 is preserved. The memory cell 400 is then de-selected, e.g., by driving its address line AL to logic low to turn off its access transistors 403 and 404.

The datalines are then pre-charged again (step 704). Control circuit 230 implements a read operation in the manner described above (step 705), and data read from the selected cell 400 via output line 524 is compared with the write data (step 706). If there is a match, transistor MP2 is considered non-defective. Conversely, if there is not a match, transistor MP2 is considered defective.

To test PMOS transistor MP1 in memory cell 400 for defects, logic 510 writes a logic zero (e.g., DIN=0) into the memory cells in row 300 (step 707). After the write operation, control circuit 230 pre-discharges the dataline pair to ground potential (step 708), and then control circuit 230 tri-states the dataline segment pairs, as described above (step 709).

The selected memory cell 400 is stressed to determine whether its pull-up transistor MP1 is defective (step 710). For example, the address line AL of the selected memory cell 400 is asserted to turn on the cell's access transistors 403 and 404, thereby coupling its Q output to DL(2) and coupling its $\overline{Q}$ output to $\overline{DL(2)}$. Because Q is logic low, the selected cell's PMOS pull-up transistor MP1 is conductive and should maintain the $\overline{Q}$ output in the logic high state. If PMOS transistor MP1 cannot overpower keeper latch 525 (2), e.g., because of defects in transistor MP1, the $\overline{Q}$ output discharges via access transistor 404 and $\overline{DL(2)}$, thereby flipping the logic state of the selected cell 400. Otherwise, if PMOS transistor MP1 can overpower keeper latch 525(2), the logic low state of the selected cell 400 is preserved. The memory cell 400 is then de-selected, e.g., by driving its address line AL to logic low to turn off its access transistors 403 and 404.

The datalines are then pre-charged again (step 711). Control circuit 230 implements a read operation (step 712), and data read from the selected cell 400 via output line 529 is compared with the write data (step 713). If there is a match, transistor MP1 is considered non-defective. Conversely, if there is not a match, transistor MP1 is considered defective.

Thus, as described above, keeper latches 520 and 525 compensate for leakage currents in memory cells 310 in corresponding row segments without disturbing read operations. In addition, keeper latches 520 and 525 provide a benchmark against which to test the PMOS pull-up transistors and NMOS pull-down transistors in the memory cells for defects.

Figure 12:
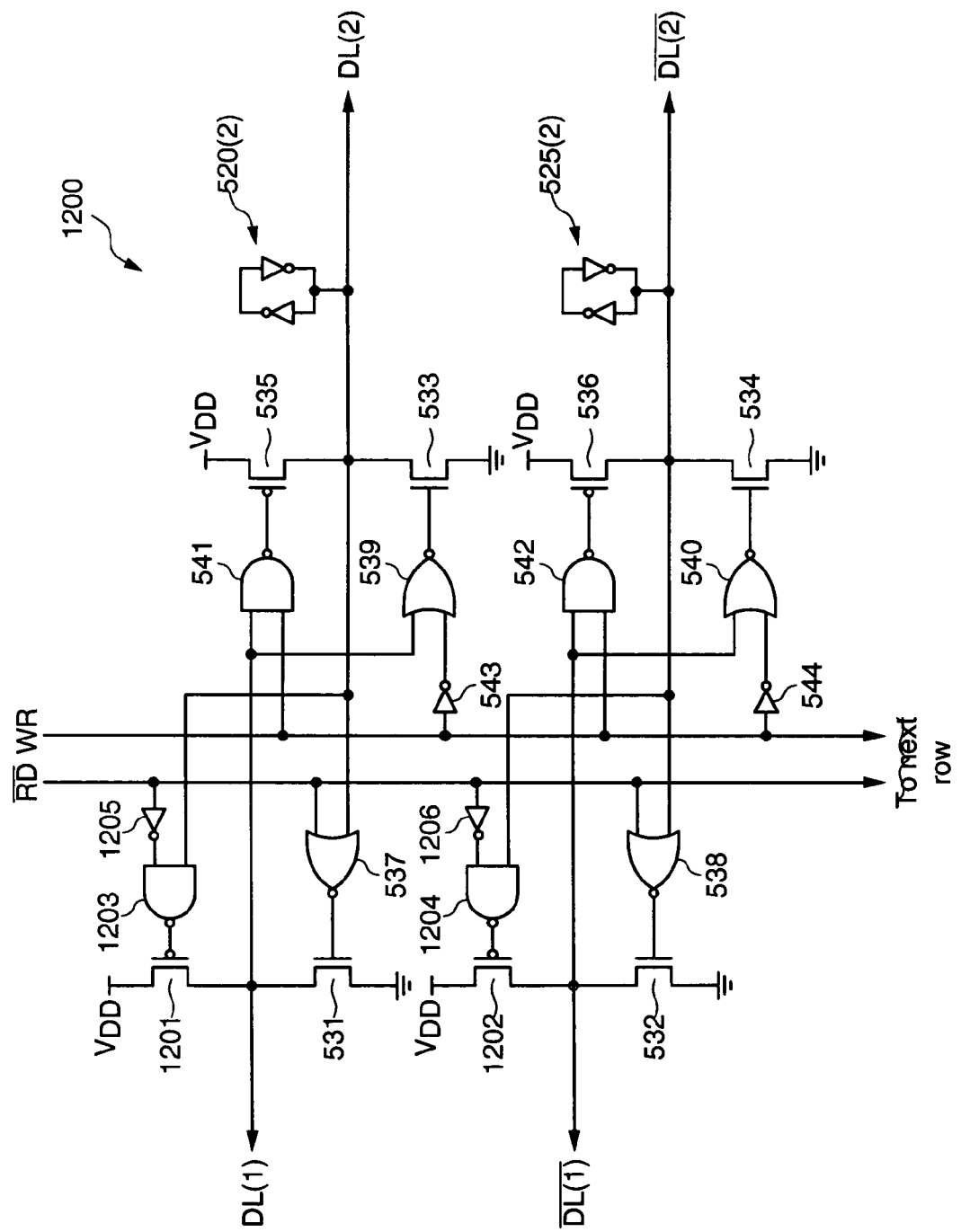
FIG. 12 is a schematic diagram of another embodiment of the dataline driver of FIG. 5.

During read operations, dataline driver 214(1) can propagate only logic low signals from DL(2) to DL(1) via NMOS transistor 531 and logic low signals from $\overline{DL(2)}$ to $\overline{DL(1)}$ via NMOS transistor 532. For other embodiments, additional circuitry can be added to dataline driver 214 to allow logic high signals to propagate from the second row segment to the first row segment during read operations. For example, FIG. 12 shows a dataline driver 1200 that is another embodiment of dataline driver 214. Dataline driver 1200 is similar to dataline driver 214, with the addition of PMOS transistors 1201–1202, NAND gates 1203–1204, and inverters 1205–1206. PMOS transistor 1201 is coupled between $V_{DD}$ and DL(1) and has a gate coupled to the output of NAND gate 1203, which includes a first input coupled to DL(2) and a second input to receive $\overline{RD}$ via inverter 1205. Together, PMOS transistor 1201 and NAND gate 1203 allow a logic high signal on DL(2) to propagate to DL(1) during read operations. Similarly, PMOS transistor 1202 is coupled between $V_{DD}$ and $\overline{DL(1)}$ and has a gate coupled to the output of NAND gate 1204, which includes a first input coupled to $\overline{DL(2)}$ and a second input to receive $\overline{RD}$ via inverter 1206. Together, PMOS transistor 1202 and NAND gate 1204 allow a logic high signal on $\overline{DL(2)}$ to propagate to $\overline{DL(1)}$ during read operations.

Accordingly, for embodiments that utilize the dataline driver 1200 of FIG. 12, the PMOS pull-up transistors MP1 and MP2 in memory cells 400 may be tested in the manner described above for testing the NMOS pull-down transistors MN1 and MN2, thereby eliminating steps 702–704 and 709–711 which, in turn, reduces testing time. However, although allowing for faster testing of PMOS transistors MP1 and MP2, dataline driver 1200 occupies more silicon area than dataline driver 214.

Figure 8:
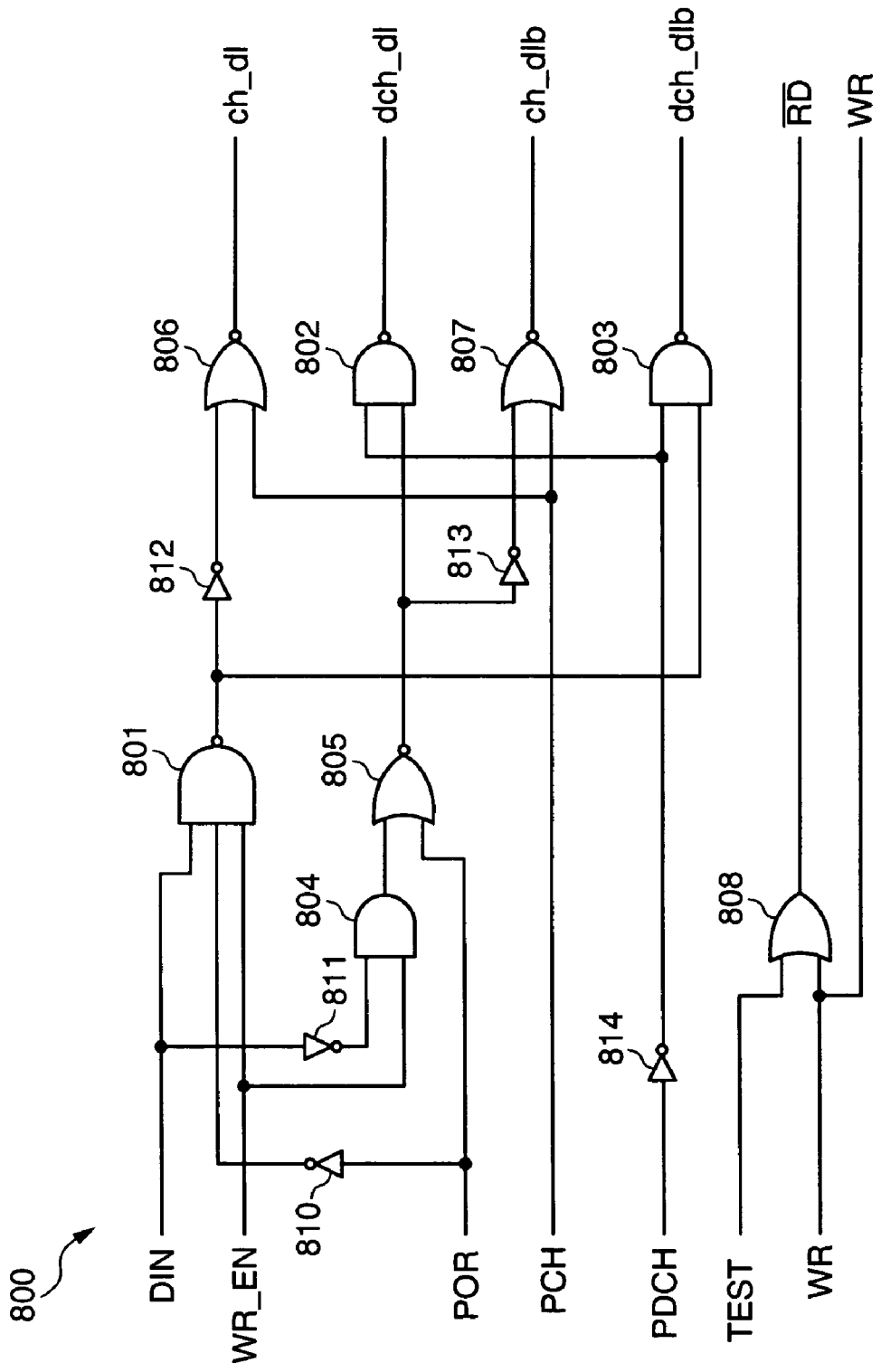
FIG. 8 is a schematic diagram for one embodiment of logic employed by the control circuit of FIG. 5.

FIG. 8 shows logic 800 that is one embodiment of logic 510 of FIG. 5A for controlling a row of memory cells in array 210. Logic 800 includes NAND gates 801–803, AND gate 804, NOR gates 805–807, OR gate 808, inverters 810–814, and inputs to receive a data bit DIN, a write enable signal WR_EN, a power-on reset signal POR, a pre-charge signal PCH, a pre-discharge signal PDCH, a test signal TEST, and the write control signal WR. In response to DIN and the control signals, logic 800 generates the dataline control signals ch_dl, dch_dl, ch_dlb, and dch_dlb and the dataline driver control signals $\overline{RD}$ and WR.

During write operations, TEST, PCH, PDCH, and POR are de-asserted to logic low, and WR_EN and WR are asserted to logic high. Because WR is logic high, $\overline{RD}$ is de-asserted to logic high. Thus, if DIN=1, then ch_dl is asserted to logic low and dch_dl is de-asserted to logic low to charge DL(1) to logic high, and ch_dlb is de-asserted to logic high and dch_dlb is asserted to logic high to discharge $\overline{DL(1)}$ to logic low. Conversely, if DIN=0, then ch_dl is de-asserted to logic high and dch_dl is asserted to logic high to discharge DL(1) to logic low, and ch_dlb is asserted to logic low and dch_dlb is de-asserted to logic low to charge $\overline{DL(1)}$ to logic high.

During read operations, TEST, WR_EN, WR, PDCH, and POR are de-asserted to logic low. Because TEST and WR are logic low, $\overline{RD}$ is asserted to logic low. When PCH is asserted to logic high, signals ch_dl and ch_dlb are both asserted to logic low, thereby pre-charging DL(1) and $\overline{DL(1)}$ to logic high. Signals dch_dl and dch_dlb are both de-asserted to logic low in response to a de-asserted logic low state of PDCH. Thereafter, when PCH is de-asserted to logic low for reading data from a selected cell, signals ch_dl and ch_dlb are both de-asserted to logic high.

During test operations, when PDCH is asserted to logic high, dch_dl and dch_dlb are both asserted to logic high, thereby pre-discharging DL(1) and $\overline{DL(1)}$ to logic low. Signals ch_dl and ch_dlb are both de-asserted to logic low in response to PCH. If POR is asserted to logic high, ch_dl is de-asserted and dch_dl is asserted to drive DL(1) to logic low, and ch_dlb is asserted and dch_dlb is de-asserted to drive $\overline{DL(1)}$ to logic high, thereby providing a logic zero data bit on the dataline pair.

Figure 9A:
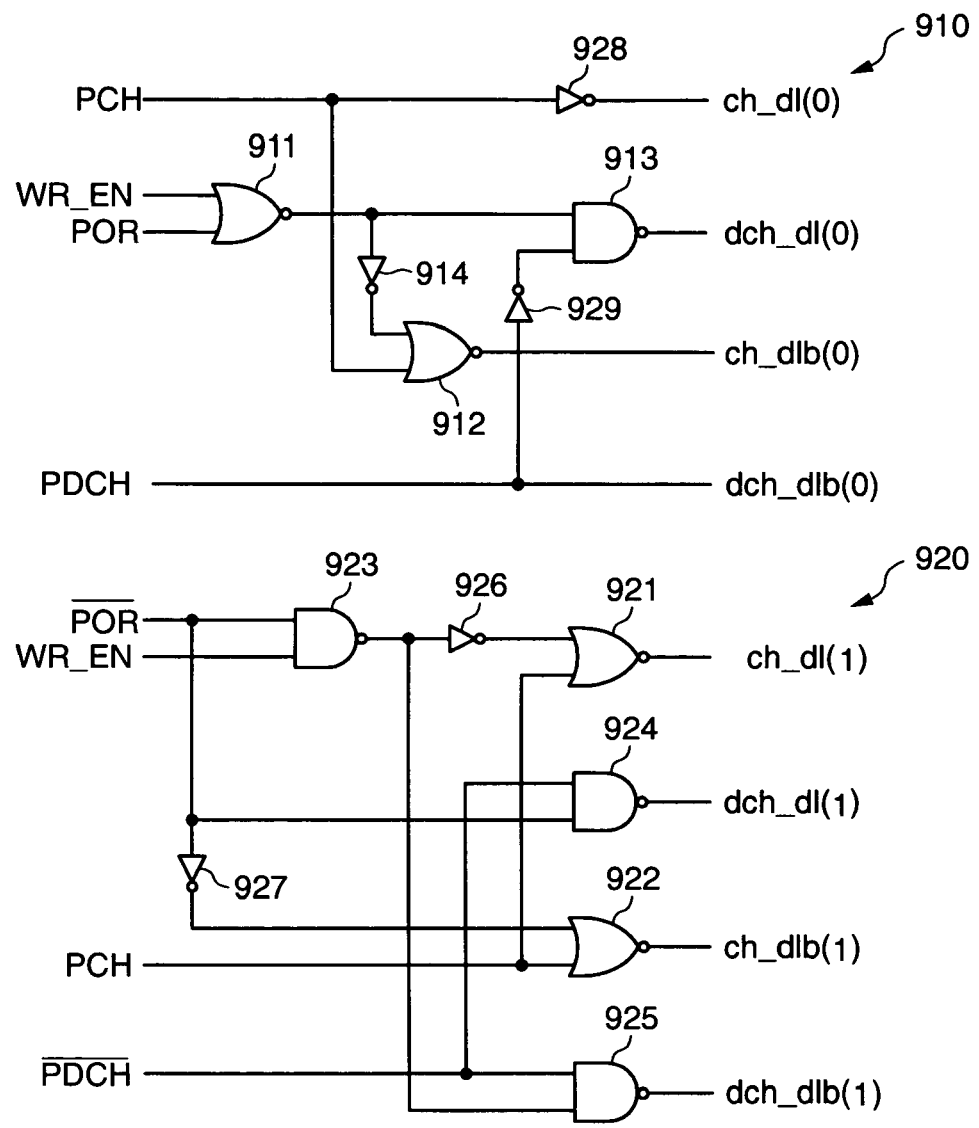
FIG. 9 is a schematic diagram for another embodiment of logic employed by the control circuit of FIG. 5.
Figure 9:
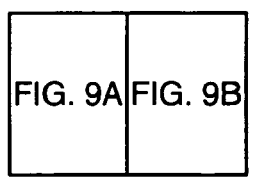
Figure 9B:
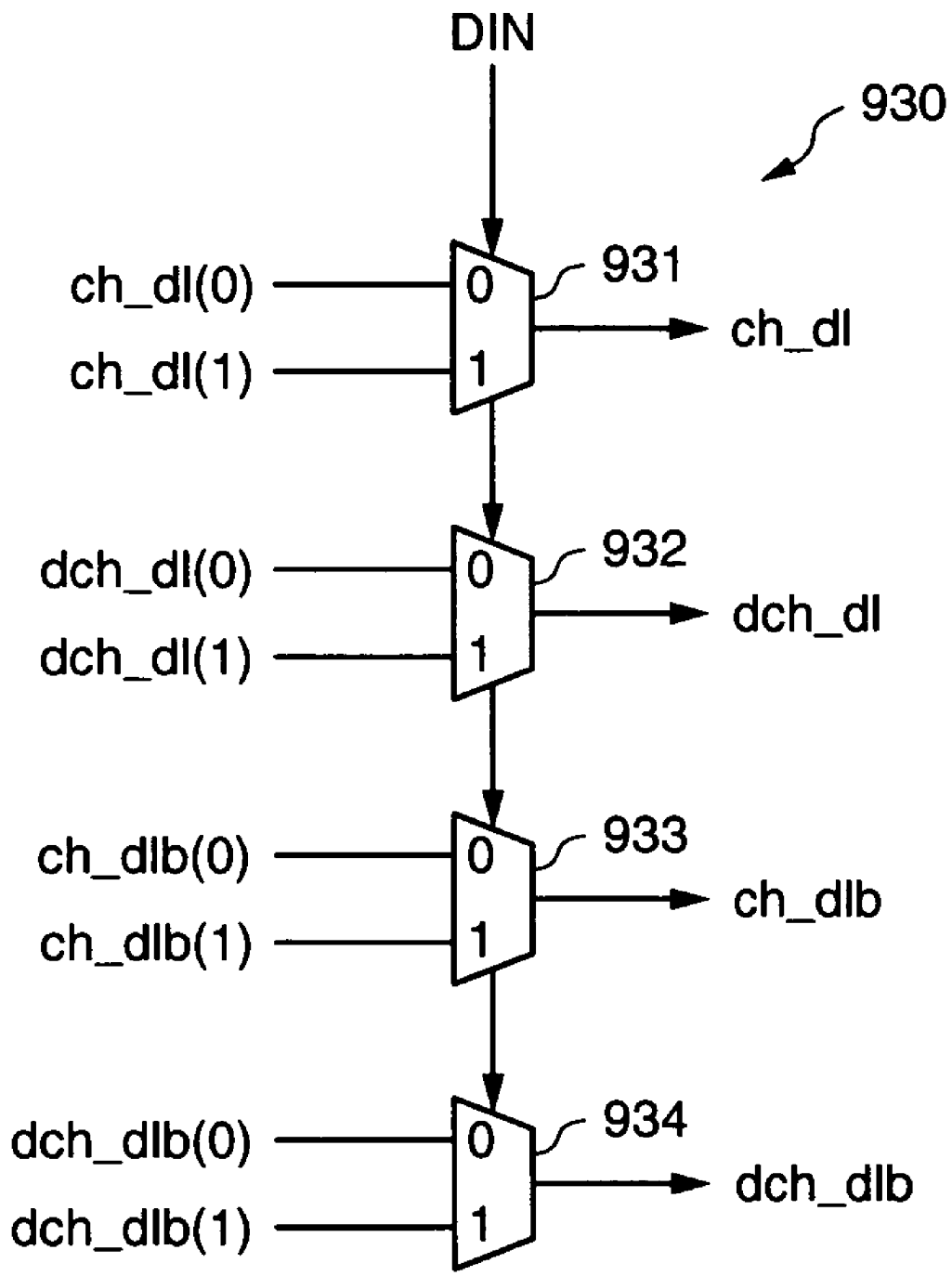

FIG. 9 shows another embodiment of logic 800 that can be used to generate the dataline control signals for multiple rows. Logic 900 includes a first logic portion 910, a second logic portion 920, and a third logic portion 930. First and second logic portions 910 and 920 perform logic functions similar to logic 800 of FIG. 8. First logic portion 910 includes NOR gates 911–912, a NAND gate 913, and inverters 914, 928, and 929 to generate a first set of dataline control signals ch_dl(0), dch_dl(0), ch_dlb(0), and dch_dlb (0) for DIN=0. Second logic portion 920 includes NOR gates 921–922, NAND gates 923–925, and inverters 926–927 to generate a second set of dataline control signals ch_dl(1), dch_dl(1), ch_dlb(1), and dch_dlb(1) for DIN=1.

Third logic portion 930 includes four multiplexers 931–934, each having a first input to receive a corresponding control signal from the first logic portion 910, a second input to receive a corresponding control signal from the second logic portion 920, a control terminal to receive DIN, and an output coupled to a corresponding one of transistors 511–514, respectively, of control circuit 230 (see also FIG. 5). Although not shown in FIG. 9 for simplicity, each row 300 of the array has a corresponding third logic portion 930 to provide either the dataline control signals for DIN=0 or the dataline control signals for DIN=1 to the row. For example, if DIN=1, multiplexers 931–934 provide ch_dl(1), dch_dl(1), ch_dlb(1), and dch_dlb(1) to transistors 511–514, respectively, of control circuit 230. Conversely, if DIN=0, multiplexers 931–934 provide ch_dl(0), dch_dl(0), ch_dlb (0), and dch_dlb(0) to transistors 511–514, respectively, of control circuit 230. Because the same dataline control signals generated by first and second logic portions 910 and 920 can be used to control the datalines in each row of array 210 via the row's corresponding third portion 930, the logic circuitry of first and second portions 910 and 920 do not need to be replicated for each row in the array, thereby saving area, for example, over logic embodiments of FIG. 8.

Figure 10:
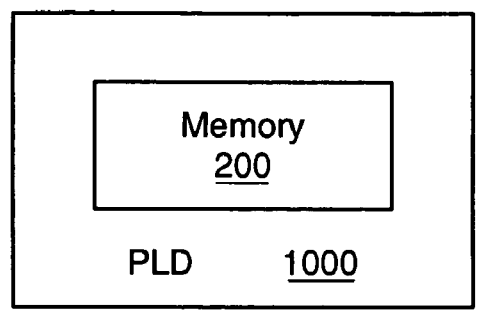
FIG. 10 shows a memory system of the present invention used as a configuration memory array for a programmable logic device.

Memory system 200 can be used as a configuration memory for a programmable logic device (PLD) 1000, as illustrated in FIG. 10. A PLD is a well-known general purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a general interconnect structure that can be programmed to selectively route signals among the various CLBs and IOBs to produce more complex functions of many input signals. The CLBs, IOBs, and the general interconnect structure are programmed by loading configuration data into associated configuration memory cells of memory system 200 that control various switches and multiplexers within the CLBs, IOBs, and the interconnect structure to implement logic and routing functions specified by the configuration data. For some embodiments, the configuration data is provided to memory system 200 as a configuration bitstream via DBUS (see also FIG. 2). A more detailed description of the general operation of FPGAs is provided in "The Programmable Logic Databook 1998" pages 4-1 to 4-68 available from Xilinx, Inc. of San Jose, Calif., and incorporated by reference herein.

For one embodiment in which memory system 200 is used for the configuration memory for an FPGA, the array 210 of memory system 200 includes approximately 1280 rows and approximately 1600 columns of memory cells, with dataline drivers 214 provided between row segments having 400 columns of memory cells.

Figure 11:
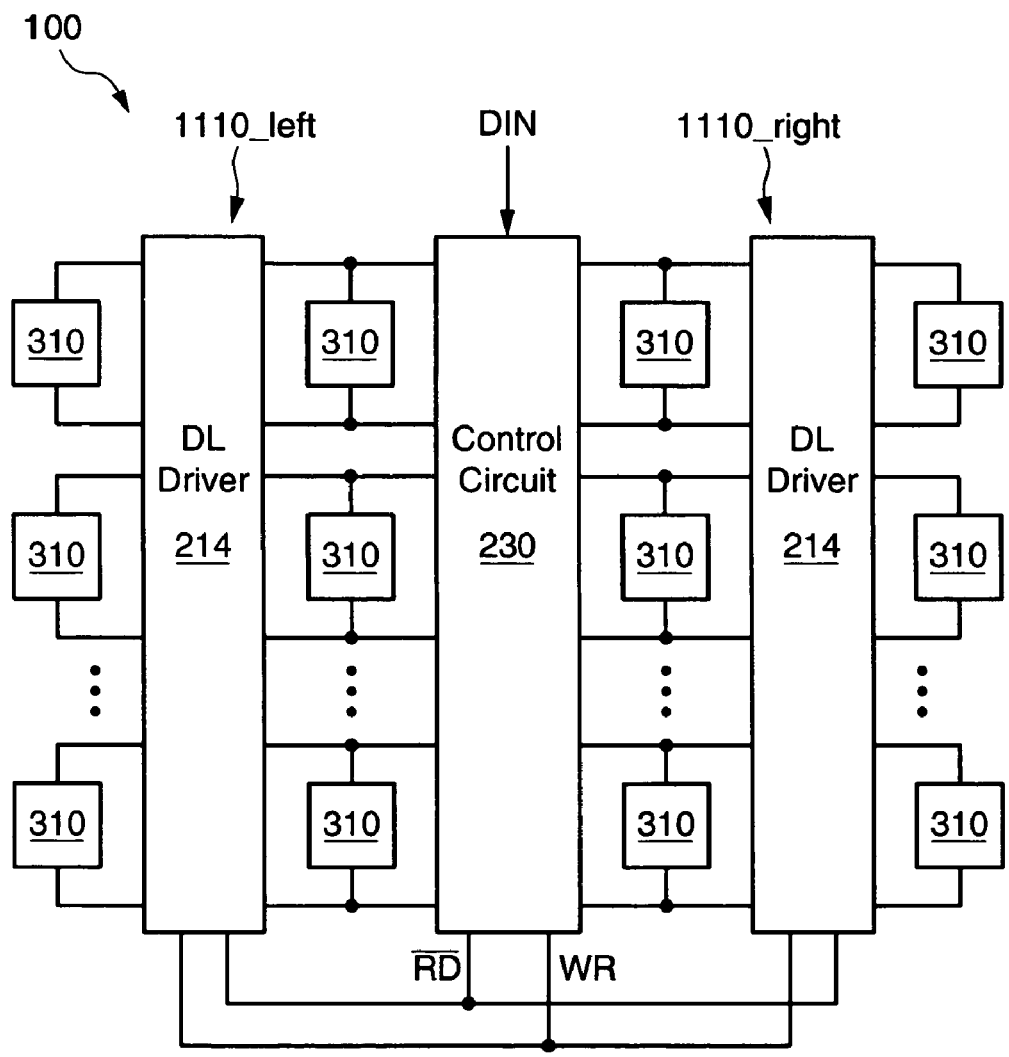
FIG. 11 is a simplified block diagram of a memory system in accordance with another embodiment of the present invention.

FIG. 11 shows a memory system 1100 in accordance with another embodiment of the present invention. Memory system 1100 is similar to memory system 200 described above, except that control circuit 230 is positioned in the center of the memory array, and has first ports coupled to first rows 1110_right and second ports coupled to second rows 1110_left. For such embodiments, control circuit 230 of FIG. 5 is duplicated, with a first portion controlling operations of rows 1110_right and a second portion controlling rows 1110_left. Further, although shown in FIG. 11 as including only two row segments and one dataline driver 214, rows 1110_left and rows 1110_right can include any number of row segments and dataline drivers.

Figure 13B:
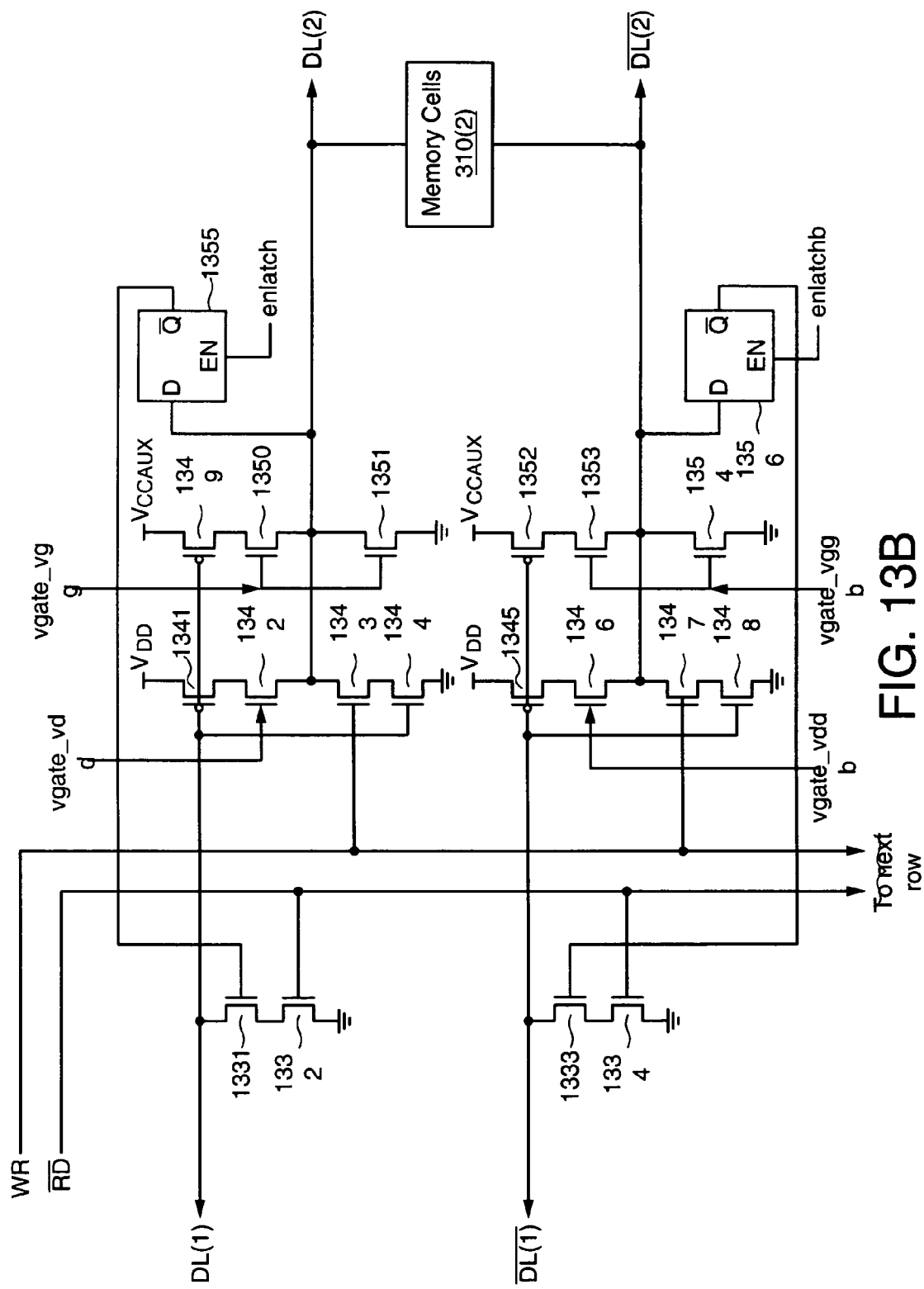
FIG. 13 is a schematic for another embodiment of the memory row of FIG. 5.

FIG. 13 shows another embodiment of the memory row of FIG. 5. This embodiment operates similarly to the embodiment of FIG. 5, but may be used in memories that include memory cells requiring at least two different voltages. As shown in FIG. 13, a memory row includes logic 1310 and transistors 1311–1324. Two power supplies, $V_{DD}$ and $V_{CCAUX}$, are used in this embodiment. For example, $V_{DD}$ may be 1.2V and $V_{CCAUX}$ may be 2.5V in a particular application. Other voltages are also possible. Four new control signals vgate_vdd, vgate_vddb, vgate_vgg, and vgate_vggb control the voltage levels applied to the memory cells. For instance, if $V_{DD}$ is 1.2V and $V_{CCAUX}$ is 2.5V, the memory cells can be driven either to a voltage of 1.2V, or a voltage of 1.5V or greater depending on the control signals. In some embodiments, control signals vgate_vgg and vgate_vggb are provided by a voltage regulator and may have a voltage of 2.3V.

The memory row of FIG. 13 is also segmented, and transistors 1331–1354 are used to signals between the dataline segments, similarly to earlier-described embodiments. In some embodiments, latches 1325–1326 and 1355–1356 are controlled by latch enable signals enlatch and enlatchb to read data from the dataline segments. This use of a latch may protect other portions of the circuit from potentially destructive high voltages. The control signals in FIG. 13 are similar to control signals provided in FIG. 5, and may generated by similar circuitry. In some embodiments, transistors 1311–1324 and 1331–1354 may be high voltage transistors having a thicker gate oxide, and control signals used to drive these transistors may be level-shifted to drive higher voltage levels.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although the memory device is described above as having complementary dataline pairs for each row segment, memory devices in other embodiments can have a single dataline for each row segment.

What is claimed is:

1. A memory including at least one row, the at least one row comprising:
   a first row segment having a first plurality of memory cells coupled to a first dataline segment;
   a second row segment having a second plurality of memory cells coupled to second dataline segment;
   a control circuit providing read and write control signals to enable driving of the first row segment and the second row segment, the control circuit connected to the first row segment to enable data propagation in compliance with the read and write control signals; and
   a dataline driver connected between the first and second dataline segments and having inputs connected to the control circuit to receive the read and write control signals, the dataline driver configurable to propagate data only in a first direction from the second row segment to the first row segment toward the control circuit during a read operation and to propagate data only in a second direction from the first row segment to the second row segment from the control circuit during a write operation.

2. The memory of claim 1, wherein the dataline driver includes outputs to provide the read and write control signals to a dataline driver in a second row of the memory.

3. The memory of claim 1, wherein the dataline driver is configurable to selectively drive the first dataline segment in response to the second dataline segment during read operations and to selectively drive the second dataline segment in response to the first dataline segment during write operations.

4. The memory of claim 1, wherein the dataline driver comprises:
   a first pull-up transistor coupled between a supply voltage and the second dataline segment;

a first pull-down transistor coupled between the second dataline segment and ground potential;

a first NAND gate having a first input coupled to the first dataline segment, a second input responsive to the write control signal, and an output coupled to a gate of the first pull-up transistor; and a first NOR gate having a first input coupled to the first dataline segment, a second input responsive to the write control signal, and an output coupled to a gate of the first pull-down transistor.

5. The memory of claim 4, wherein the dataline driver further comprises:

a second pull-down transistor coupled between the first dataline segment and ground potential; and a second NOR gate having a first input coupled to the second dataline segment, a second input responsive to the read control signal, and an output coupled to a gate of the second pull-down transistor.

6. The memory of claim 5, wherein the dataline driver further comprises:

a second pull-up transistor coupled between the supply voltage and the first dataline segment; and a second NAND gate having a first input coupled to the second dataline segment, a second input responsive to the read control signal, and an output coupled to a gate of the second pull-up transistor.

7. The memory of claim 1, wherein the first row segment includes a keeper latch, comprising:

a strong inverter having an input coupled to the first dataline segment and having an output; and a weak inverter having an input coupled to the output of the strong inverter and having an output coupled to the first dataline segment.

8. The memory of claim 1, wherein the first row segment and the dataline driver comprise a tile adapted to be replicated any number of times to form the at least one row.

9. The memory of claim 1, wherein the first and second row segments have an equal number of memory cells.

10. The memory of claim 1, further comprising a control circuit coupled to the first dataline segment, the control circuit configurable to pre-discharge the first dataline segment.

11. The memory of claim 10, wherein the dataline driver is configurable to pre-discharge the second dataline segment.

12. The memory of claim 10, wherein the control circuit further comprises:

a logic circuit having first inputs to receive one or more control signals, a second input to receive write data, and first and second outputs;

a pull-up transistor coupled between a supply voltage and the first dataline segment and having a gate coupled to the first output of the logic circuit; and a pull-down transistor coupled between the first dataline segment and ground potential and having a gate coupled to the second output of the logic circuit.

13. The memory of claim 12, wherein the logic circuit is configurable to tri-state the first dataline segment in response to the control signals.

14. The memory of claim 12, wherein the logic circuit comprises:

a first portion for generating first charge and discharge signals in response to the write data being of a first logic state;

a second portion for generating second charge and discharge signals in response to the write data being of a second logic state; and at least one third portion for selectively providing either the first charge and discharge signals or the second charge and discharge signals to the respective gates of the pull-up and pull-down transistors in a corresponding row.

15. The memory of claim 14, wherein the at least one third portion comprises a multiplexer circuit.

16. The memory of claim 14, wherein the first charge and discharge signals and the second charge and discharge signals are provided concurrently to each row in the memory.

17. The memory of claim 16, wherein each row is associated with a corresponding third portion of the logic circuit.

18. The memory of claim 1, wherein the first and second dataline segments each comprise a pair of complementary dataline segments.

19. The memory of claim 18, wherein the memory cells comprise SRAM cells connected between the complementary dataline segments.

20. The memory of claim 1, wherein the memory is a configuration memory for a programmable logic device.

21. The memory of claim 1, wherein the dataline driver the dataline driver is further configurable to propagate data in the first and second directions at a plurality of voltage levels.

22. A memory including any number of rows, each row comprising:

a plurality of row segments, each having a plurality of memory cells coupled to a corresponding dataline segment; and a plurality of dataline drivers, each connected to the dataline segments in first and second adjacent row segments and configured to drive the dataline segment in the first adjacent row segment in response to a logical combination of a control signal and data on the dataline segment in the second adjacent row segment.

23. The memory of claim 22, wherein the control signal comprises read and write signals.

24. The memory of claim 22, wherein the dataline driver is configured to propagate data only from the dataline segment in the first adjacent row segment to the dataline segment in the second adjacent row segment during write operations and configured to propagate data only from the dataline segment in the second adjacent row segment to the dataline segment in the first adjacent row segment during read operations.

25. The memory of claim 22, wherein each dataline driver comprises:

a first pull-up transistor coupled between a supply voltage and the dataline segment in the second adjacent row segment;

a first pull-down transistor coupled between the dataline segment in the second adjacent row segment and ground potential;

a first NAND gate having a first input coupled to the dataline segment in the first adjacent row segment, a second input responsive to the control signal, and an output coupled to a gate of the first pull-up transistor; and a first NOR gate having a first input coupled to the dataline segment in the first adjacent row segment, a second input responsive to the control signal, and an output coupled to a gate of the first pull-down transistor.

26. The memory of claim 25, wherein the dataline driver further comprises:

a second pull-down transistor coupled between the dataline segment in the first adjacent row segment and ground potential; and a second NOR gate having a first input coupled to the dataline segment in the second adjacent row segment, a second input responsive to the control signal, and an output coupled to a gate of the second pull-down transistor.

27. The memory of claim 26, wherein the dataline driver further comprises:

a second pull-up transistor coupled between the supply voltage and the dataline segment in the first adjacent row segment; and a second NAND gate having a first input coupled to the dataline segment in the second adjacent row segment, a second input responsive to the control signal, and an output coupled to a gate of the second pull-up transistor.

28. The memory of claim 22, wherein the dataline segments in the first and second adjacent row segments each comprise a pair of complementary dataline segments.

29. The memory system of claim 22, wherein each row segment further comprises a keeper latch having a drive strength configured to compensate for leakage currents in the corresponding row segment without disturbing read operations.

30. The memory of claim 22, wherein the memory comprises a configuration memory in a programmable logic device.

31. A memory including any number of rows, each row comprising:

a plurality of row segments, each having a plurality of memory cells coupled to a corresponding dataline segment; and a plurality of dataline drivers, each connected to the dataline segment in adjacent row segments and comprising:

a first pull-up transistor coupled between a supply voltage and the dataline segment in a first adjacent row segment;

a first pull-down transistor coupled between the dataline segment in the first adjacent row segment and ground potential;

a first NAND gate having a first input coupled to the dataline segment in a second adjacent row segment, a second input responsive to a control signal, and an output coupled to a gate of the first pull-up transistor; and a first NOR gate having a first input coupled to the dataline segment in the second adjacent row segment, a second input responsive to the control signal, and an output coupled to a gate of the first pull-down transistor.

32. The memory of claim 31, wherein the dataline driver further comprises:

a second pull-down transistor coupled between the dataline segment in the second adjacent row segment and ground potential; and a second NOR gate having a first input coupled to the dataline segment in the first adjacent row segment, a second input responsive to the control signal, and an output coupled to a gate of the second pull-down transistor.

33. The memory of claim 32, wherein the dataline driver further comprises:

a second pull-up transistor coupled between the supply voltage and the dataline segment in the second adjacent row segment; and a second NAND gate having a first input coupled to the dataline segment in the first adjacent row segment, a second input responsive to the control signal, and an output coupled to a gate of the second pull-up transistor.

34. The memory of claim 31, wherein the memory comprises a configuration memory for a programmable logic device.

35. A method of operating a memory having a plurality of row segments each having a dataline segment connected to a dataline segment in an adjacent row segment by a corresponding dataline driver, comprising:

configuring each dataline driver to propagate data only in a first direction from a previous row segment to a next row segment during write operations; and configuring each dataline driver to propagate data only in a second direction from the next row segment to the previous row segment during read operations.

36. The method of claim 35, further comprising:

for each row segment, providing a keeper latch to maintain the corresponding dataline segment in its current logic state; and sizing the keeper latches to compensate for leakage currents in corresponding row segments without disturbing read operations.

37. The method of claim 35, further comprising:

selectively charging the dataline segment in the next row segment in response to a first logical combination of data on the dataline segment in the previous row segment and a control signal using a first pull-up transistor; and selectively discharging the dataline segment in the next row segment in response to a second logical combination of data on the dataline segment in the previous row segment and the control signal using a first pull-down transistor.

38. The method of claim 37, further comprising:

selectively discharging the dataline segment in the previous row segment in response to a third logical combination of data on the dataline segment in the next row segment and the control signal using a second pull-down transistor.

39. The method of claim 38, further comprising:

selectively charging the dataline segment in the previous row segment in response to a fourth logical combination of data on the dataline segment in the next row segment and the control signal using a second pull-up transistor.

* * * * *